US012648303B2

(12) United States Patent
Song et al.

(10) Patent No.: US 12,648,303 B2
(45) Date of Patent: Jun. 2, 2026

(54) DISPLAY APPARATUS AND METHOD OF MANUFACTURING THE SAME

(71) Applicant: Samsung Display Co., Ltd., Yongin-si (KR)

(72) Inventors: Eunho Song, Yongin-si (KR); Sehun Kim, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 486 days.

(21) Appl. No.: 17/984,815

(22) Filed: Nov. 10, 2022

(65) Prior Publication Data

US 2023/0172004 A1     Jun. 1, 2023

(30) Foreign Application Priority Data

Nov. 30, 2021     (KR) ........................ 10-2021-0169345

(51) Int. Cl.
 *H10K 59/122*     (2023.01)
 *H10K 50/115*     (2023.01)
 *H10K 59/12*     (2023.01)
 *H10K 71/00*     (2023.01)
(52) U.S. Cl.
 CPC ......... *H10K 59/122* (2023.02); *H10K 50/115* (2023.02); *H10K 71/00* (2023.02); *H10K 59/1201* (2023.02)
(58) Field of Classification Search
 None
 See application file for complete search history.

(56) References Cited

U.S. PATENT DOCUMENTS

| | | | |
|---|---|---|---|
| 8,035,302 B2 | 10/2011 | Hong | |
| 8,120,010 B2 | 2/2012 | Cho et al. | |
| 9,780,256 B2 | 10/2017 | Yang et al. | |
| 11,322,554 B2 | 5/2022 | Song | |
| 11,758,779 B2* | 9/2023 | Jo ........................ | H10K 59/131 |
| | | | 257/40 |

(Continued)

FOREIGN PATENT DOCUMENTS

| | | |
|---|---|---|
| CN | 112885871 A | 6/2021 |
| KR | 10-0606815 B1 | 8/2006 |

(Continued)

OTHER PUBLICATIONS

International Search Report dated Mar. 6, 2023, issued in corresponding PCT Patent Application No. PCT/KR2022/019092, 3 pages.

*Primary Examiner* — Michelle Mandala
(74) *Attorney, Agent, or Firm* — Womble Bond Dickinson (US) LLP

(57) ABSTRACT

A display apparatus includes: a substrate having a display area and a peripheral area surrounding at least a portion of the display area; a first display element in the display area and including a first emission layer including a plurality of first quantum dots, the first emission layer to emit light of a first color; and a pixel definition layer on the substrate and including a first opening defining a first emission area of the first display element, a first trench spaced from the first opening in a first direction and extending in a second direction intersecting the first direction, and a first groove connecting the first opening to the first trench.

13 Claims, 29 Drawing Sheets

(56) References Cited

U.S. PATENT DOCUMENTS

| 12,069,898 B2 * | 8/2024 | Ma | H10K 59/8723 |
|---|---|---|---|
| 12,289,953 B2 * | 4/2025 | Ji | H10K 59/38 |
| 12,490,592 B2 * | 12/2025 | Song | H10K 59/873 |
| 2009/0009057 A1 | 1/2009 | Lee et al. | |
| 2012/0132935 A1 | 5/2012 | Isobe et al. | |
| 2016/0211316 A1 * | 7/2016 | Oh | H10K 59/121 |
| 2016/0315217 A1 | 10/2016 | Yang et al. | |
| 2020/0295100 A1 | 9/2020 | Liu et al. | |
| 2021/0005834 A1 | 1/2021 | Lee et al. | |
| 2021/0005840 A1 | 1/2021 | Lu et al. | |
| 2021/0167147 A1 | 6/2021 | Nakatani et al. | |
| 2023/0050529 A1 * | 2/2023 | Hu | H10K 59/123 |

FOREIGN PATENT DOCUMENTS

| KR | 10-0835059 B1 | 6/2008 |
|---|---|---|
| KR | 10-0852112 B1 | 8/2008 |
| KR | 10-1557498 B1 | 10/2015 |
| KR | 10-1626525 B1 | 6/2016 |
| KR | 10-2016-0113112 A | 9/2016 |
| KR | 10-1740798 B1 | 5/2017 |
| KR | 10-2021-0004748 A | 1/2021 |
| KR | 10-2021-0120176 A | 10/2021 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2021-0169345, filed on Nov. 30, 2021, in the Korean Intellectual Property Office (KIPO), the entire disclosure of which is incorporated by reference herein.

BACKGROUND

1. Field

One or more embodiments relate to a display apparatus and a method of manufacturing the same.

2. Description of the Related Art

Display apparatuses may visually display data. A display apparatus may be used as a display unit of a small product such as a mobile phone or may be used as a display unit of a large product such as a television.

A display apparatus may include a plurality of pixels that receive an electrical signal to emit light to display an image to the outside. Each pixel may include a display element, for example, an organic light emitting diode as a display element in the case of an organic light emitting display apparatus.

Recently, as the use of display apparatuses has diversified, various designs have been attempted to improve the quality of display apparatuses. For example, various research has been attempted to use a quantum-dot light emitting diode as a display element and promote a positive aging effect of the quantum-dot light emitting diode.

SUMMARY

Aspects of one or more embodiments of the present disclosure are directed to a display apparatus capable of promoting a positive aging effect of a quantum-dot light emitting diode and a method of manufacturing the display apparatus.

Technical solutions to be achieved by the present disclosure are not limited to the technical solutions mentioned above, and other technical solutions not mentioned above may be clearly understood from the description of the present disclosure by those of ordinary skill in the art.

Additional aspects will be set forth in part in the description which follows and, in part, will be apparent from the description, or may be learned by practice of the presented embodiments of the present disclosure.

According to one or more embodiments, a display apparatus includes a substrate having a display area and a peripheral area surrounding at least a portion of the display area, a first display element in the display area and including a first emission layer including a plurality of first quantum dots, the first emission layer to emit light of a first color, and a pixel definition layer on the substrate and including a first opening defining a first emission area of the first display element, a first trench spaced from the first opening in a first direction and extending in a second direction intersecting the first direction, and a first groove connecting the first opening to the first trench.

According to an example, the display apparatus may further include a second display element in the display area and including a second emission layer including a plurality of second quantum dots, the second emission layer to emit light of a second color. The pixel definition layer may further include a second opening defining a second emission area of the second display element, and a second groove connecting the second opening to the first trench.

According to an example, the first groove may include a plurality of first grooves. The second groove may include a plurality of second grooves. The first opening may be larger than the second opening. A number of the plurality of first grooves may be greater than a number of the plurality of second grooves.

According to an example, the first opening may be larger than the second opening. A first width of the first groove in the second direction may be greater than a second width of the second groove in the second direction.

According to an example, the first display element may include a pixel electrode at least partially exposed by the first opening, a first functional layer between the pixel electrode and the first emission layer and at least partially in the first opening, the first groove, and the first trench, a second functional layer on the first emission layer and at least partially in the first opening, the first groove, and the first trench, and an opposite electrode on the second functional layer and at least partially in the first opening, the first groove, and the first trench.

According to an example, the display apparatus may further include a resin layer in the peripheral area and on the opposite electrode.

According to an example, the display apparatus may further include a resin layer in the display area and surrounding at least a portion of the first opening, the first groove, and the first trench on the opposite electrode.

According to an example, the pixel definition layer may include a first portion corresponding to the first trench and the first groove and having a first thickness, and a second portion surrounding at least a portion of the first portion and having a second thickness greater than the first thickness.

According to an example, the display apparatus may further include an insulating layer between the substrate and the first display element. The pixel definition layer may expose at least a portion of the insulating layer corresponding to the first trench.

According to an example, the pixel definition layer may include a first portion corresponding to the first groove and having a first thickness, and a second portion surrounding at least a portion of the first portion and having a second thickness greater than the first thickness.

According to an example, the pixel definition layer may include a first portion corresponding to the first trench, a second portion corresponding to the first groove, and a third portion surrounding at least a portion of the first portion and the second portion. A first vertical distance from an upper surface of the substrate to an upper surface of the first portion may be less than a second vertical distance from the upper surface of the substrate to an upper surface of the second portion. The second vertical distance may be less than a third vertical distance from the upper surface of the substrate to an upper surface of the third portion.

According to an example, the pixel definition layer may further include a second trench spaced from the first opening in the first direction and extending in the second direction, and a second groove connecting the first opening to the second trench. The first opening may be located between the first trench and the second trench.

According to an example, the first display element may include a plurality of first display elements, the first opening may include a plurality of first openings, the first trench may include a plurality of first trenches, and the first groove may include a plurality of first grooves. The plurality of first display elements may be arranged in a matrix in the first direction and the second direction. The plurality of first openings may respectively define first emission areas of the plurality of first display elements. The plurality of first trenches may be located between rows of the plurality of first display elements. The plurality of first grooves may connect the plurality of first openings to the plurality of first trenches.

According to one or more embodiments, a method of manufacturing a display apparatus includes preparing a substrate having a display area and a peripheral area surrounding at least a portion of the display area, forming, in the display area, a first display element including a first emission layer including a plurality of first quantum dots, the first emission layer to emit light of a first color, forming, on the substrate, a pixel definition layer including a first opening defining a first emission area of the first display element, a first trench spaced from the first opening in a first direction and extending in a second direction intersecting the first direction, and a first groove connecting the first opening to the first trench, forming a resin layer on the first display element, and annealing the resin layer.

According to an example, the resin layer may include an aging element. The annealing of the resin layer may include diffusing the aging element from the resin layer.

According to an example, the aging element may reach the first opening along the first trench and the first groove.

According to an example, the resin layer may be in the peripheral area.

According to an example, the resin layer may be in the display area and may surround at least a portion of the first opening, the first groove, and the first trench.

According to an example, the forming of the pixel definition layer may include forming an insulating material layer on the substrate, and forming the pixel definition layer by partially removing a first portion of the insulating material layer in which the first trench and the first groove are to be formed and removing a second portion of the insulating material layer in which the first opening is to be formed.

According to an example, the method may further include forming a second display element in the display area and including a second emission layer including a plurality of second quantum dots, the second emission layer to emit light of a second color. The pixel definition layer may further include a second opening defining a second emission area of the second display element, and a second groove connecting the second opening to the first trench.

According to an example, the first groove may include a plurality of first grooves. The second groove may include a plurality of second grooves. The first opening may be larger than the second opening. A number of the plurality of first grooves may be greater than a number of the plurality of second grooves.

According to an example, the first opening may be larger than the second opening. A first width of the first groove in the second direction may be greater than a second width of the second groove in the second direction.

According to an example, the pixel definition layer may further include a second trench spaced from the first opening in the first direction and extending in the second direction, and a second groove connecting the first opening to the second trench. The first opening may be located between the first trench and the second trench.

According to an example, the forming of the first display element may include forming a pixel electrode on the substrate, forming a first functional layer between the pixel electrode and the first emission layer and at least partially in the first opening, the first groove, and the first trench, forming a second functional layer on the first emission layer and at least partially in the first opening, the first groove, and the first trench, and forming an opposite electrode on the second functional layer and at least partially in the first opening, the first groove, and the first trench.

According to an example, the forming of the first display element may include forming the first emission layer by using an inkjet method.

According to another aspect of the present disclosure, a display apparatus includes a substrate, a first display element on the substrate and including a first emission layer including a plurality of first quantum dots, the first emission layer to emit light of a first color, a second display element on the substrate and including a second emission layer including a plurality of second quantum dots, the second emission layer to emit light of a second color, and a pixel definition layer on the substrate and including a first opening defining a first emission area of the first display element, a second opening defining a second emission area of the second display element, and a first groove connecting the first opening to the second opening.

According to an example, the display apparatus may further include a third display element on the substrate and including a third emission layer including a plurality of third quantum dots, the third emission layer to emit light of a third color. The pixel definition layer may further include a third opening defining a third emission area of the third display element, and a second groove connecting the second opening to the third opening.

According to an example, the display apparatus may further include a resin layer on the first display element and the second display element and surrounding at least a portion of the first opening, the second opening, and the first groove.

According to an example, the pixel definition layer may include a first portion corresponding to the first groove and having a first thickness, and a second portion surrounding at least a portion of the first portion and having a second thickness greater than the first thickness.

Other aspects, features, and advantages other than those described above will become apparent from the following detailed description, the appended claims, and the accompanying drawings.

These general and particular aspects may be implemented by using systems, methods, computer programs, or any combinations of systems, methods, and computer programs.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 15 is an enlarged plan view schematically illustrating a portion of a display apparatus according to one or more embodiments;

FIGS. 19 to 23 are diagrams for describing a method of manufacturing a display apparatus, according to one or more embodiments;

DETAILED DESCRIPTION

Figure 1:
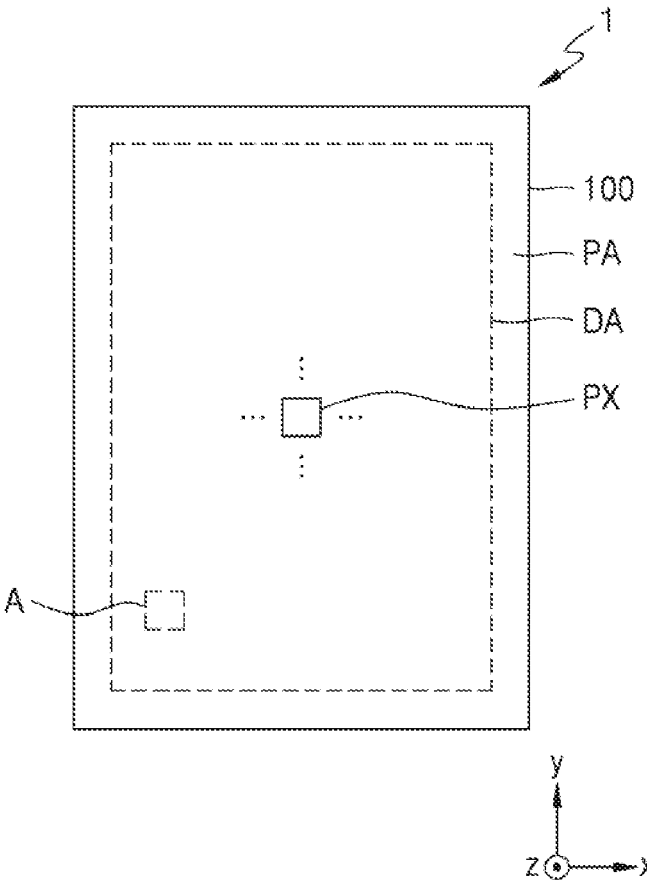
FIG. 1 is a plan view schematically illustrating a display apparatus according to one or more embodiments.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in more detail. The effects and features of the present disclosure and the accomplishing methods thereof will become apparent from the embodiments described below in more detail with reference to the accompanying drawings. However, the present disclosure is not limited to the embodiments described below and may be embodied in various suitable modes.

Further, the use of "may" when describing embodiments of the present disclosure refers to "one or more embodiments of the present disclosure."

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Hereinafter, embodiments will be described in more detail with reference to the accompanying drawings, and in the following description, like reference numerals will denote like elements and redundant descriptions thereof will not be provided for conciseness.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of elements in the drawings may be exaggerated for convenience of description. In other words, because the sizes and thicknesses of elements in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component and/or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view schematically illustrating a display apparatus according to one or more embodiments.

Referring to FIG. 1, a display apparatus 1 may include a display area DA displaying an image and a peripheral area PA around (e.g., surrounding) at least a portion of the display area DA. The display apparatus 1 may provide an image to the outside by using light emitted from the display area DA. Because the display apparatus 1 includes a substrate 100, it may be said that the substrate 100 may include the display area DA and the peripheral area PA.

The substrate 100 may include various materials such as glass, metal, or plastic. According to one or more embodiments, the substrate 100 may include a flexible material. Here, the flexible material may refer to a material that may be easily bent, curved, folded, or rolled. The substrate 100 of the flexible material may include ultra-thin glass, metal, or plastic.

The display area DA may have a rectangular shape as illustrated in FIG. 1. In other embodiments, the display area DA may have a polygonal shape such as a triangular, pentagonal, or hexagonal shape, a circular shape, an elliptical shape, an atypical shape, and/or the like.

Pixels PX including various display elements such as quantum-dot light emitting diodes may be arranged in the display area DA of the substrate 100. The pixel PX may include a plurality of pixels PX, and the plurality of pixels PX may be arranged in various forms such as a stripe arrangement, a PENTILE® arrangement (PENTILE® is a registered trademark of Samsung Display Co., Ltd., Republic of Korea), such as an RGBG arrangement, or a mosaic arrangement to implement an image. Hereinafter, each pixel PX may refer to each of subpixels emitting different colors, and each pixel PX may be, for example, one of a red subpixel, a green subpixel, and a blue subpixel.

Although a quantum-dot light emitting display apparatus will be described as an example of a display apparatus according to one or more embodiments, the display apparatus of the present disclosure is not limited thereto. In other embodiments, the display apparatus of the present disclosure may be a display apparatus such as an inorganic light emitting display apparatus (or an inorganic EL display apparatus) or an organic light emitting display apparatus. For example, an emission layer of the display element included in the display apparatus may include an organic material, may include an inorganic material, may include quantum dots, may include an organic material and quantum dots, may include an inorganic material and quantum dots, or may include an organic material, an inorganic material, and quantum dots.

The peripheral area PA of the substrate 100 may be an area arranged around the display area DA and may be an area where an image is not displayed. In the peripheral area PA, various lines for transmitting an electrical signal to be applied to the display area DA, and pads to which a printed circuit board or a driver IC chip is attached may be located.

Figure 2:
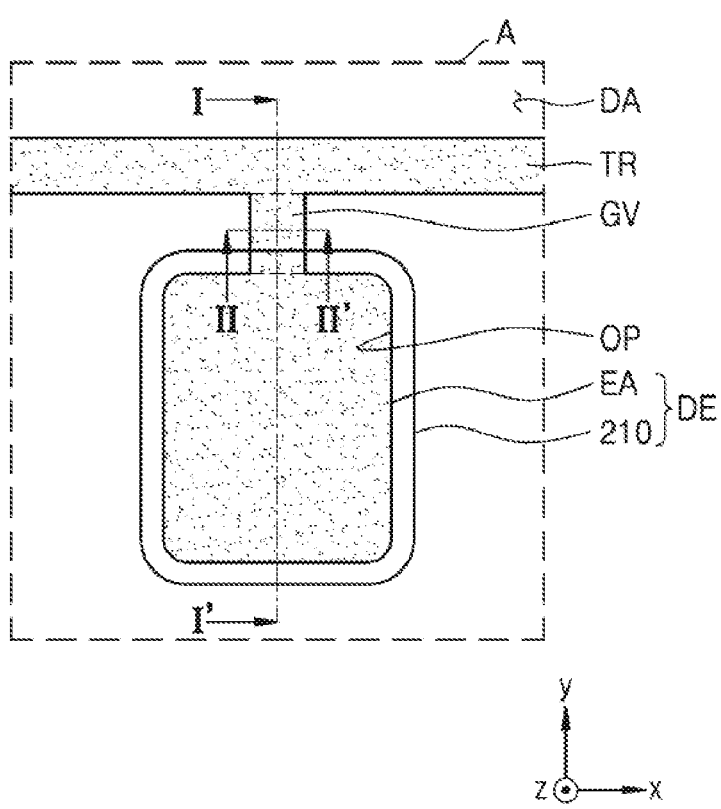
FIG. 2 is an enlarged plan view schematically illustrating a portion of a display apparatus according to one or more embodiments.

FIG. 2 is an enlarged plan view schematically illustrating a portion of a display apparatus according to one or more embodiments.

Referring to FIG. 2, the display apparatus 1 (see FIG. 1) may include a display element DE, an opening OP, a trench TR, and a groove GV arranged in the display area DA.

Figure 3:
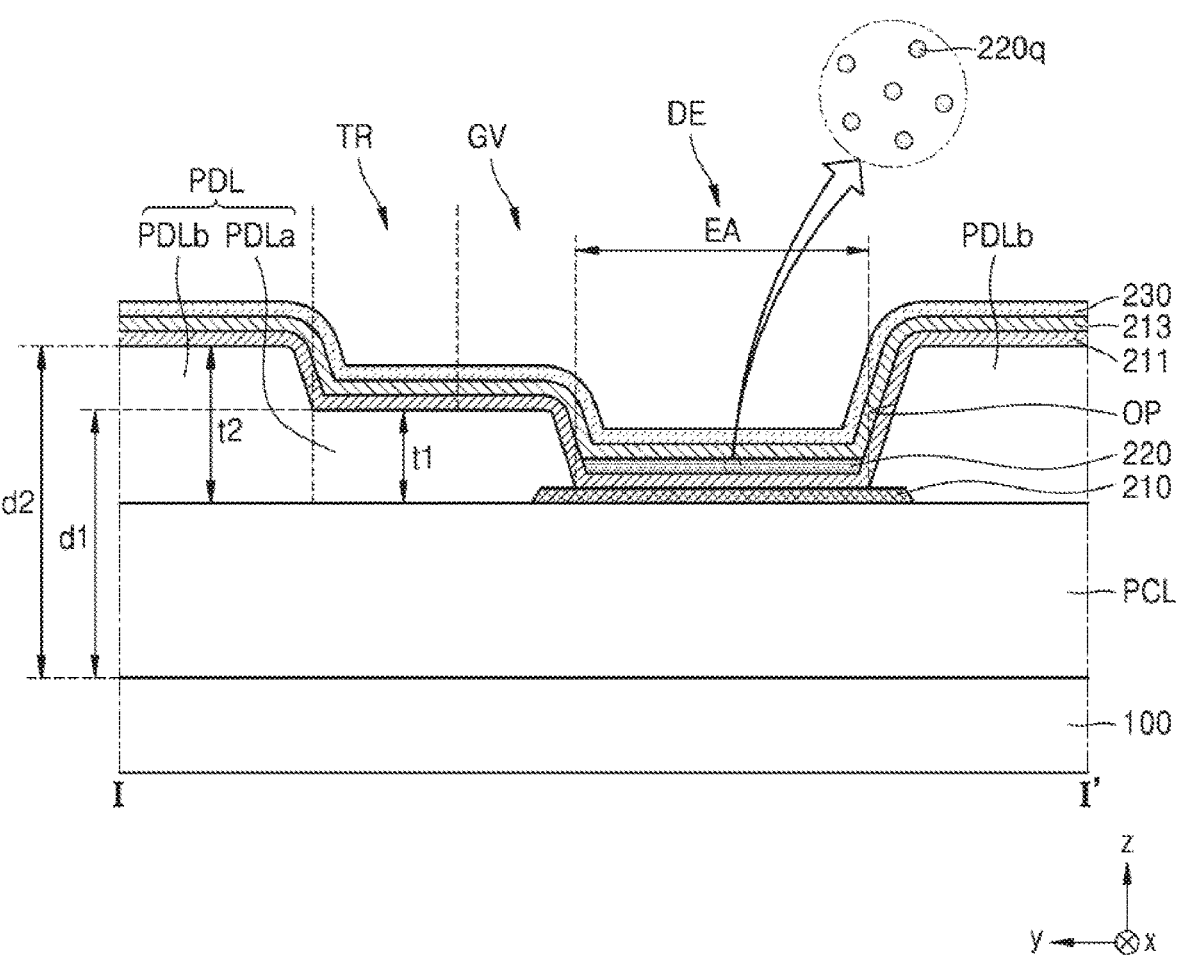
FIG. 3 is a cross-sectional view of a portion of the display apparatus taken along the line I-I' of FIG. 2.

The display element DE may include a pixel electrode 210 and an emission area EA from which light is emitted. The display element DE may be a quantum-dot light emitting diode including a plurality of quantum dots $220q$ as illustrated in FIG. 3 described below.

FIG. 2 illustrates that the planar shape of the pixel electrode 210 is a rounded rectangular shape; however, in other embodiments, the pixel electrode 210 may have various shapes such as a circular shape, an elliptical shape, a polygonal shape such as a tetragonal shape, or a diamond shape.

The opening OP may define the emission area EA of the display element DE. As illustrated in FIG. 3 described below, the opening OP may be formed in a pixel definition layer PDL and may expose at least a portion of the pixel electrode 210.

FIG. 2 illustrates that the planar shape of the opening OP is a rounded rectangular shape; however, in other embodiments, the opening OP may have various shapes such as a circular shape, an elliptical shape, a polygonal shape such as a tetragonal shape, or a diamond shape.

The trench TR may be spaced from the opening OP in a first direction (e.g., ±y direction) and may extend in a second direction (e.g., ±x direction) crossing the first direction (e.g., ±y direction). In one or more embodiments, the first direction may be perpendicular to the second direction. The trench TR may be formed in the pixel definition layer PDL as illustrated in FIG. 3 described below.

The groove GV may connect the opening OP to the trench TR. In other words, the trench TR may be connected to the opening OP through the groove GV. The groove GV may be formed in the pixel definition layer PDL as illustrated in FIG. 3 described below. In one or more embodiments, the groove GV may extend in the first direction (e.g., ±y direction) to connect the trench TR to the opening OP.

The trench TR and the groove GV may function as a path for uniformly diffusing (or transmitting) an aging element AE (e.g., a gas) from a resin layer arranged on the display element DE to the opening OP as described below in FIG. 22. When the aging element AE reaches the opening OP, that is, the display element DE, a positive aging effect of the display element DE that is a quantum-dot light emitting diode may be promoted. In this case, the positive aging effect may be contrasted with brightness reduction and efficiency reduction and degradation of the quantum-dot light emitting diode, which is often referred to as a negative aging effect.

FIG. 3 is a cross-sectional view of a portion of the display apparatus taken along the line I-I' of FIG. 2.

Referring to FIG. 3, the display apparatus 1 may include a substrate 100, a circuit layer PCL on the substrate 100, a pixel definition layer PDL on the circuit layer PCL, and a display element DE on the circuit layer PCL.

The substrate 100 may include glass or polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multilayer structure including a barrier layer and a base layer including the above polymer resin.

Figure 5:
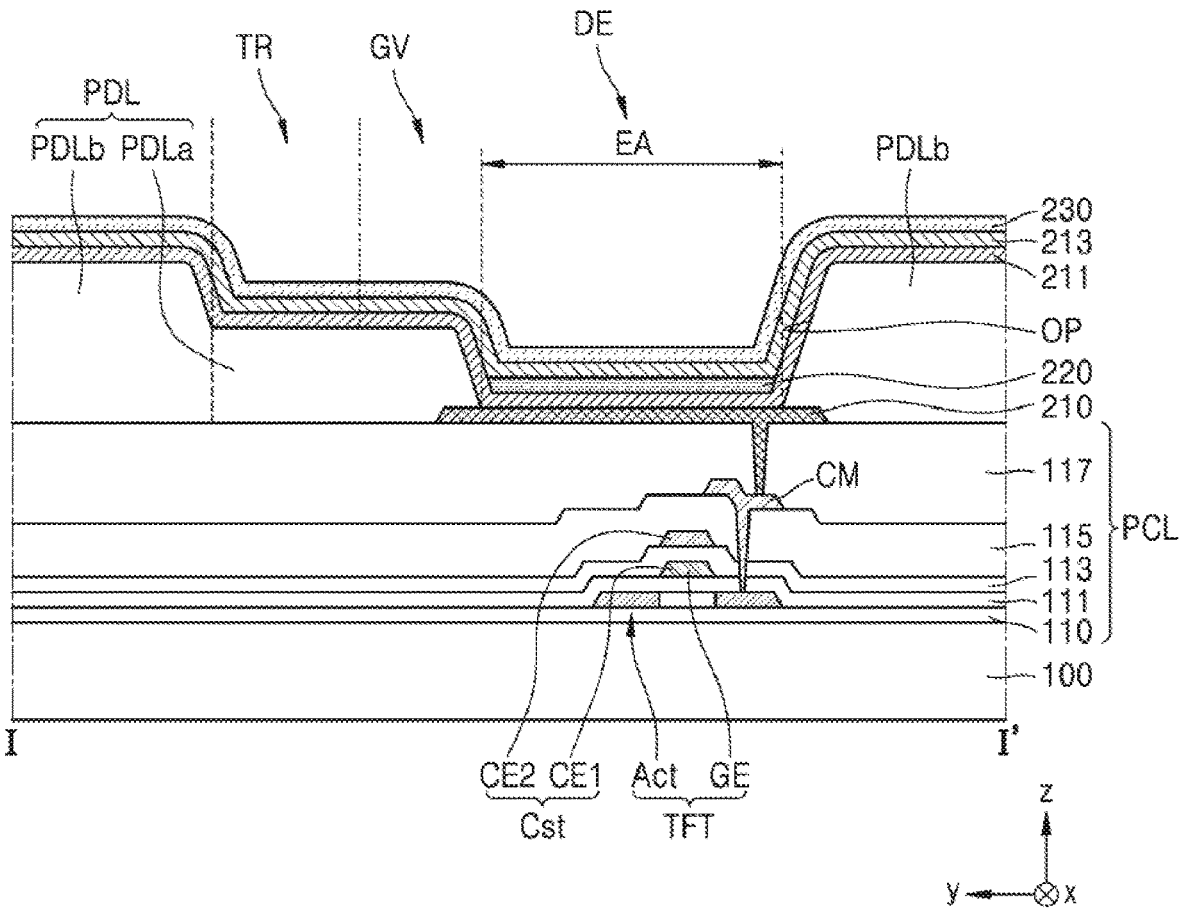
FIG. 5 is a cross-sectional view of a portion of the display apparatus taken along the line I-I' of FIG. 2.

The circuit layer PCL may include a pixel circuit for driving the display element DE. The pixel circuit may include at least one transistor and at least one storage capacitor. The circuit layer PCL may include at least one insulating layer. For example, as illustrated in FIG. 5 described below, the circuit layer PCL may include a buffer layer 110, a first gate insulating layer 111, a second gate insulating layer 113, an interlayer insulating layer 115, and a planarization layer 117.

The pixel definition layer PDL may cover an edge of the pixel electrode 210 of the display element DE and may include an opening OP exposing a center portion of the pixel electrode 210. The emission area EA of the display element DE may be defined by the opening OP. The pixel definition layer PDL may prevent or reduce the occurrence of an arc and/or the like at the edge of the pixel electrode 210 by increasing the distance between the edge of the pixel electrode 210 and an opposite electrode 230 over the pixel electrode 210.

The pixel definition layer PDL may include a trench TR and a groove GV. The trench TR may be spaced from the opening OP in the first direction (e.g., ±y direction) and may extend in the second direction (e.g., ±x direction) as described above with reference to FIG. 2. The groove GV may connect the opening OP to the trench TR.

The pixel definition layer PDL may include a first portion PDLa corresponding to the trench TR and the groove GV and a second portion PDLb around (e.g., surrounding) at least a portion of the first portion PDLa. The second portion PDLb may extend from the first portion PDLa.

In one or more embodiments, a first thickness t1 of the first portion PDLa may be less than a second thickness t2 of the second portion PDLb. In other words, a first vertical distance d1 from the upper surface of the substrate 100 to the upper surface of the first portion PDLa may be less than a second vertical distance d2 from the upper surface of the substrate 100 to the upper surface of the second portion PDLb.

The pixel definition layer PDL may include an organic insulating material of at least one of polyimide, polyamide, acrylic resin, benzocyclobutene, and phenol resin. The pixel definition layer PDL may include an organic insulating material. In one or more embodiments, the pixel definition layer PDL may include an inorganic insulating material such as silicon nitride, silicon oxynitride, or silicon oxide. In one or more embodiments, the pixel definition layer PDL may include an organic insulating material and an inorganic insulating material. In one or more embodiments, the pixel definition layer PDL may include a light blocking material and may be provided in black. The light blocking material may include a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). When the pixel definition layer PDL includes the light blocking material, the reflection of external light by metal structures arranged under the pixel definition layer PDL may be reduced.

The display element DE may include a pixel electrode 210, an emission layer 220, a first functional layer 211, a second functional layer 213, and an opposite electrode 230. The first functional layer 211 may be arranged between the pixel electrode 210 and the emission layer 220, and the second functional layer 213 may be arranged between the emission layer 220 and the opposite electrode 230.

The pixel electrode 210 may include a (semi)transparent electrode or a reflective electrode. In one or more embodiments, the pixel electrode 210 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or any compound thereof and a transparent or semitransparent electrode layer formed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In one or more embodiments, the pixel electrode 210 may include a triple layer. For example, the triple layer of the pixel electrode 210 may include ITO/Ag/ITO.

The emission layer 220 may be arranged in the opening OP. The emission layer 220 may include a plurality of quantum dots 220q. The emission layer 220 may include a quantum-dot material. The core of the quantum dot 220q may be selected from a Group II-VI compound, a Group III-V compound, a Group IV-VI compound, a group IV element, a Group IV compound, and any combination thereof.

The Group II-VI compound may be selected among a binary compound selected from CdSe, CdTe, ZnS, ZnSe, ZnTe, ZnO, HgS, HgSe, HgTe, MgSe, MgS, and any mixture thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-V compound may be selected among a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The Group IV-VI compound may be selected among a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPb-SeTe, SnPbSTe, and any mixture thereof. The Group IV element may be selected from Si, Ge, and any mixture thereof. The Group IV compound may include a binary compound selected from SiC, SiGe, and any mixture thereof.

In this case, the binary compound, the ternary compound, or the quaternary compound may exist in particles at a uniform concentration or may exist in the same particle with a concentration distribution partially divided into different states. Also, it may have a core/shell structure in which one quantum dot surrounds another quantum dot. The interface between the core and the shell may have a concentration gradient in which the concentration of elements in the shell decreases toward the center thereof.

In one or more embodiments, the quantum dot 220$q$ may have a core-shell structure including a core including nanoc-rystals and a shell around (e.g., surrounding) the core, as described above. The shell of the quantum dot 220$q$ may function as a protection layer for preventing or reducing chemical modification of the core to maintain semiconductor characteristics and/or as a charging layer for assigning electrophoretic characteristics to the quantum dot 220$q$. The shell may include a single layer or multiple layers. The interface between the core and the shell may have a con-centration gradient in which the concentration of elements in the shell decreases toward the center thereof. Examples of the shell of the quantum dot 220$q$ may include a metal or nonmetal oxide, a semiconductor compound, or any com-bination thereof.

For example, the metal or nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$; however, the present disclosure is not limited thereto.

Also, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like; however, the present disclosure is not limited thereto.

The quantum dot 220$q$ may have a full width at half maximum (FWHM) of an emission wavelength spectrum of about 45 nm or less, for example, about 40 nm or less or about 30 nm or less, and in this range, the color purity or the color reproducibility thereof may be improved. Also, because the light emitted through the quantum dot 220$q$ is emitted in all directions, the optical viewing angle thereof may be improved.

Also, the shape of the quantum dot 220$q$ may be a shape generally used in the art and may include, but is not limited to, spherical, pyramidal, multi-arm, or cubic nanoparticles, nanotubes, nanowires, nanofibers, nanoplate particles, and/or the like.

The quantum dot 220$q$ may control the color of light emitted according to the particle size, and accordingly, the quantum dot 220$q$ may have various emission colors such as blue, red, and green. The emission layer 220 including the quantum dots 220$q$ may emit light of various colors such as blue, red, and green.

The first functional layer 211 may include a hole transport layer (HTL) or may include an HTL and a hole injection layer (HIL). The second functional layer 213 may include an electron transport layer (ETL) or may include an ETL and an electron injection layer (EIL). For example, the ETL may include Zn-containing metal oxide nanoparticles in which a metal capable of increasing a ZnO bandgap is alloyed. The Zn-containing metal oxide may include $Zn_{1-x}Me_xO$ ($0<x\leq0.5$ and Me is Ca or Mg). For example, the ETL may include ZnMgO.

The first functional layer 211 and the second functional layer 213 may be a common layer formed to entirely cover the substrate 100. As illustrated in FIG. 3, at least a portion of each of the first functional layer 211 and the second functional layer 213 may be arranged in the opening OP, the groove GV, and the trench TR.

The opposite electrode 230 may be a transparent electrode or a reflective electrode. In one or more embodiments, the opposite electrode 230 may be a transparent or semitrans-parent electrode and may include a thin metal layer having a low work function and including lithium (Li), calcium (Ca), LiF/Ca, LiF/Al, aluminum (Al), silver (Ag), magne-sium (Mg), or any compound thereof. Also, a transparent conductive oxide (TCO) layer such as ITO, IZO, ZnO, or $In_2O_3$ may be further arranged on the thin metal layer.

The opposite electrode 230 may be arranged over the display area and may be arranged over the emission layer 220 and the pixel definition layer PDL. The opposite elec-trode 230 may be a common layer formed to entirely cover the substrate 100. As illustrated in FIG. 3, at least a portion of the opposite electrode 230 may be arranged in the opening OP, the groove GV, and the trench TR.

Moreover, although not illustrated in FIG. 3, an encap-sulation substrate may be arranged to face the substrate 100. In the peripheral area PA (see FIG. 1), the substrate 100 and the encapsulation substrate may be sealed by being attached with a sealing material such as frit.

Figure 4:
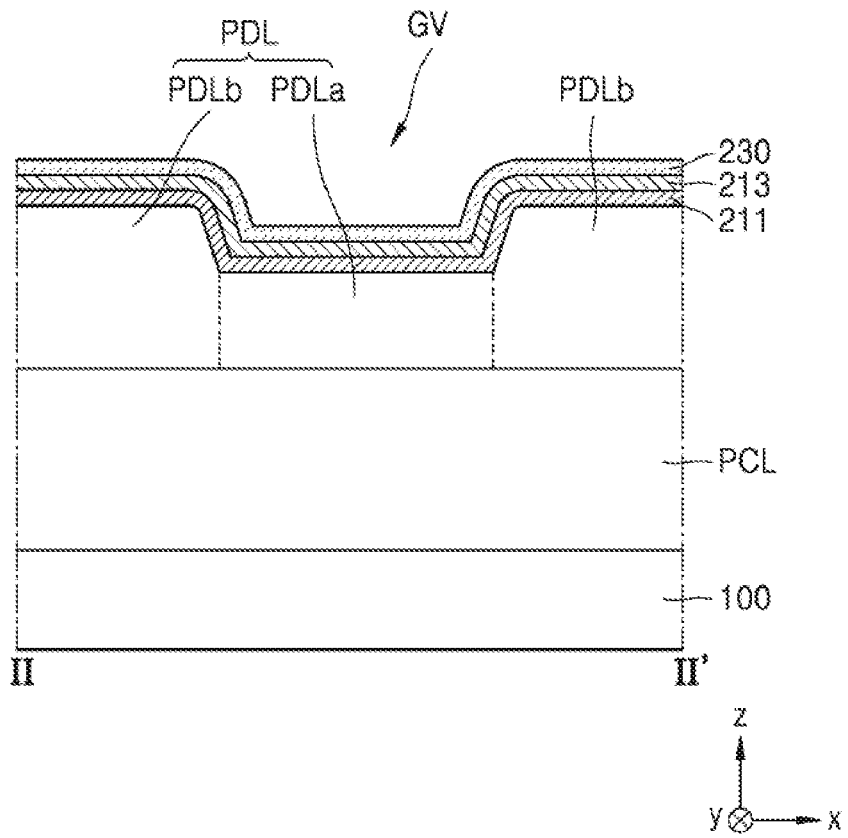
FIG. 4 is a cross-sectional view of a portion of the display apparatus taken along the line II-II' of FIG. 2.

FIG. 4 is a cross-sectional view of a portion of the display apparatus taken along the line II-II' of FIG. 2. FIG. 4 is a cross-sectional view of the groove GV of FIG. 2 taken in a different direction than FIG. 3. In FIG. 4, like reference numerals as those in FIG. 3 denote like elements, and thus, redundant descriptions thereof will not be provided for conciseness.

Referring to FIG. 4, the pixel definition layer PDL may include a first portion PDLa corresponding to the groove GV and a second portion PDLb around (e.g., surrounding) at least a portion of the first portion PDLa. The second portion PDLb may extend from the first portion PDLa.

In one or more embodiments, the thickness of the first portion PDLa may be less than the thickness of the second portion PDLb. In other words, the vertical distance from the upper surface of the substrate 100 to the upper surface of the first portion PDLa may be less than the vertical distance from the upper surface of the substrate 100 to the upper surface of the second portion PDLb.

FIG. 5 is a cross-sectional view of a portion of the display apparatus taken along the line I-I' of FIG. 2. In FIG. 5, like reference numerals as those in FIG. 3 denote like elements, and thus, redundant descriptions thereof will not be provided for conciseness.

Referring to FIG. 5, the circuit layer PCL may include a pixel circuit for driving the display element DE. The pixel circuit may include at least one transistor TFT, at least one storage capacitor Cst, and at least one connection electrode CM. The transistor TFT may include a semiconductor layer Act and a gate electrode GE, and the storage capacitor Cst may include a lower electrode CE1 and an upper electrode CE2.

The circuit layer PCL may include at least one insulating layer. For example, as illustrated in FIG. 5, the circuit layer PCL may include a buffer layer 110, a first gate insulating layer 111, a second gate insulating layer 113, an interlayer insulating layer 115, and a planarization layer 117.

Hereinafter, a configuration included in the circuit layer PCL will be described in more detail along a stack structure with reference to FIG. 5.

The buffer layer 110 may be arranged on the substrate 100. The buffer layer 110 may reduce or block the penetration of foreign materials, moisture, or external air from under the substrate 100 and may provide a flat surface on the substrate 100. The buffer layer 110 may include an inorganic insulating material such as silicon nitride, silicon oxynitride, and silicon oxide and may include a single layer or multiple layers including the inorganic insulating material.

A barrier layer may be further included between the substrate 100 and the buffer layer 110. The barrier layer may prevent, reduce, or minimize the penetration of impurities from the substrate 100 and/or the like into the semiconductor layer Act. The barrier layer may include an inorganic material such as oxide or nitride, an organic material, or an organic/inorganic composite and may include a single-layer or multiple-layer structure of an inorganic material and an organic material.

The semiconductor layer Act may be arranged on the buffer layer 110. The semiconductor layer Act may include amorphous silicon or may include polysilicon. In other embodiments, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer Act may include a channel area and a drain area and a source area respectively arranged at opposite sides of the channel area. The semiconductor layer Act may include a single layer or multiple layers.

The first gate insulating layer 111 and the second gate insulating layer 113 may be stacked and arranged on the buffer layer 110 to cover the semiconductor layer Act. The first gate insulating layer 111 and the second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may include zinc oxide (ZnO) and/or zinc peroxide ($ZnO_2$).

The gate electrode GE may be arranged on the first gate insulating layer 111 to at least partially overlap the semiconductor layer Act. The gate electrode GE may include molybdenum (Mo), aluminum (Al), copper (Cu), titanium (Ti), and/or the like and may include a single layer or multiple layers. For example, the gate electrode GE may include a single layer of Mo.

FIG. 5 illustrates that the gate electrode GE is arranged on the upper surface of the first gate insulating layer 111; however, in another embodiment, the gate electrode GE may be arranged on the upper surface of the second gate insulating layer 113.

In one or more embodiments, the storage capacitor Cst may include the lower electrode CE1 and the upper electrode CE2 and may overlap the transistor TFT as illustrated in FIG. 5. For example, the gate electrode GE of the transistor TFT may function as the lower electrode CE1 of the storage capacitor Cst. Unlike this, the storage capacitor Cst may not overlap the transistor TFT and may exist separately.

The upper electrode CE2 of the storage capacitor Cst may overlap the lower electrode CE1 with the second gate insulating layer 113 therebetween and may form a capacitance. In this case, the second gate insulating layer 113 may function as a dielectric layer of the storage capacitor Cst.

The upper electrode CE2 of the storage capacitor Cst may be arranged on the second gate insulating layer 113. The upper electrode CE2 of the storage capacitor Cst may include a conductive material including molybdenum (Mo), aluminum (Al), copper (Cu), titanium (Ti), and/or the like and may include a single layer or multiple layers including the above material.

The interlayer insulating layer 115 may be provided on the second gate insulating layer 113 to cover the upper electrode CE2 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may include zinc oxide (ZnO) and/or zinc peroxide ($ZnO_2$).

The connection electrode CM may be arranged over the interlayer insulating layer 115. The connection electrode CM may include a conductive material including molybdenum (Mo), aluminum (Al), copper (Cu), titanium (Ti), and/or the like and may include a single layer or multiple layers including the above material. For example, the connection electrode CM may include a multiple-layer structure of Ti/Al/Ti. The connection electrode CM may be connected to the source area or the drain area of the semiconductor layer Act through a contact hole formed in the first gate insulating layer 111, the second gate insulating layer 113, and the interlayer insulating layer 115.

The connection electrode CM may be covered with an inorganic protection layer. The inorganic protection layer may include a single layer or multiple layers of silicon nitride ($SiN_x$) and silicon oxide ($SiO_x$). The inorganic protection layer may be introduced to cover and protect some lines arranged on the interlayer insulating layer 115.

The planarization layer 117 may be arranged to cover the connection electrode CM, and the planarization layer 117 may include a contact hole for connecting the transistor TFT to the pixel electrode 210. The pixel electrode 210 may be connected to the connection electrode CM through the contact hole and may be connected to the semiconductor layer Act through the connection electrode CM.

The planarization layer 117 may include a single layer or multiple layers including an organic material and may provide a flat upper surface. The planarization layer 117 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

Figure 6:
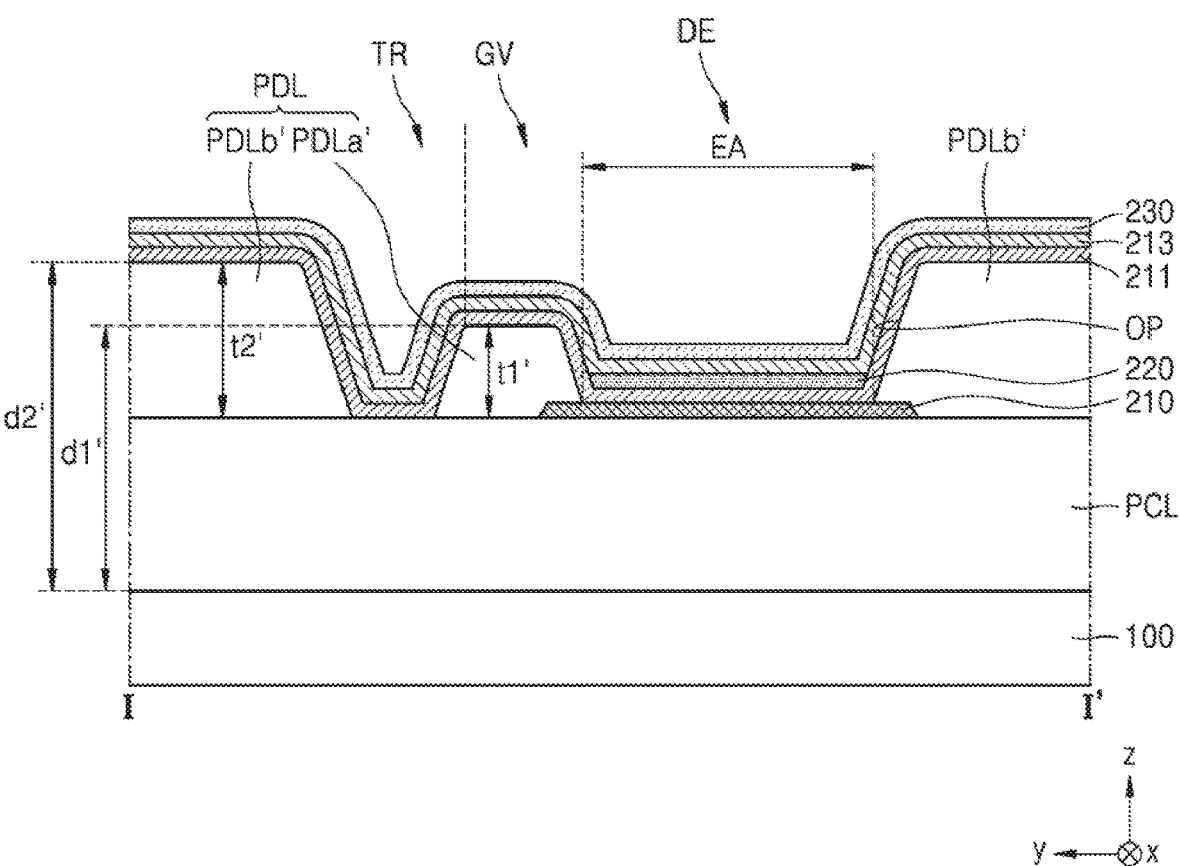
FIG. 6 is a cross-sectional view of a portion of the display apparatus taken along the line I-I' of FIG. 2.

FIG. 6 is a cross-sectional view of a portion of the display apparatus taken along the line I-I' of FIG. 2. FIG. 6 is a modification of FIG. 3 and may be different from FIG. 3 in terms of the structure of a pixel definition layer. Hereinafter, redundant descriptions thereof will not be repeated in view of the description of FIG. 3 and differences therebetween will be primarily described.

Referring to FIG. 6, the pixel definition layer PDL may include an opening OP, a trench TR, and a groove GV. The opening OP may expose at least a portion of the pixel electrode 210, and the trench TR may expose at least a portion of the circuit layer PCL. Exposing at least a portion of the circuit layer PCL may refer to exposing at least a portion of the insulating layer included in the circuit layer PCL. For example, the trench TR may expose at least a portion of the planarization layer 117 (see FIG. 5) of the circuit layer PCL.

The pixel definition layer PDL may include a first portion PDLa' corresponding to the groove GV and a second portion PDLb' around (e.g., surrounding) at least a portion of the first portion PDLa'. Although not illustrated in FIG. 6, referring to FIG. 4 described above, the second portion PDLb' may extend from the first portion PDLa'.

In one or more embodiments, a first thickness t1' of the first portion PDLa' may be less than a second thickness t2' of the second portion PDLb'. In other words, a first vertical distance d1' from the upper surface of the substrate 100 to the upper surface of the first portion PDLa' may be less than a second vertical distance d2' from the upper surface of the substrate 100 to the upper surface of the second portion PDLb'. In one or more embodiments, the first vertical distance d1' and the second vertical distance d2' may be measured in a thickness direction (e.g., ±z direction) of the substrate 100.

Figure 7:
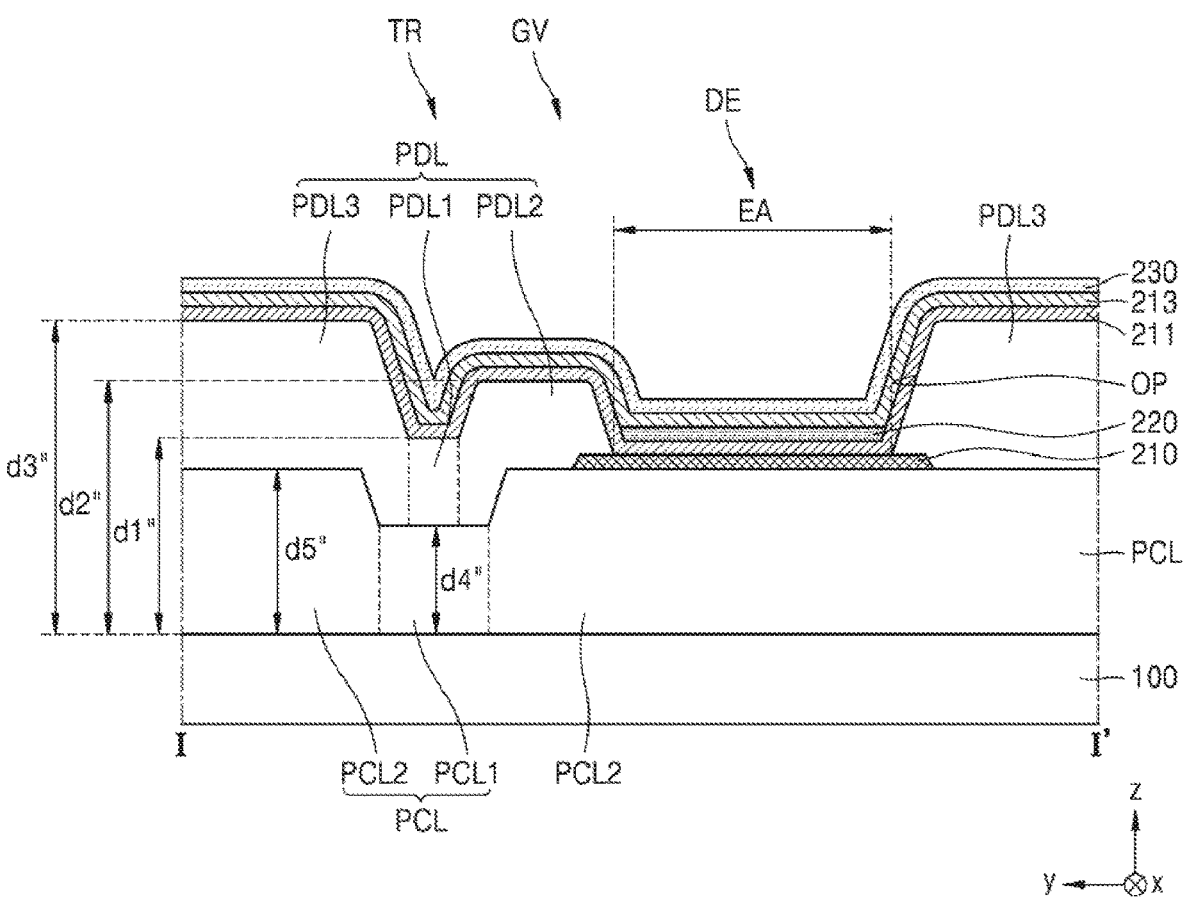
FIG. 7 is a cross-sectional view of a portion of the display apparatus taken along the line I-I' of FIG. 2.

FIG. 7 is a cross-sectional view of a portion of the display apparatus taken along the line I-I' of FIG. 2. FIG. 7 is a modification of FIG. 3 and may be different from FIG. 3 in terms of the structure of a circuit layer and a pixel definition layer. Hereinafter, redundant descriptions thereof will not be repeated in view of the description of FIG. 3 and differences therebetween will be primarily described.

Referring to FIG. 7, the circuit layer PCL may include a first portion PCL1 corresponding to the trench TR and a second portion PCL2 around (e.g., surrounding) at least a portion of the first portion PCL1. The second portion PCL2 may extend from the first portion PCL1. Because the circuit layer PCL includes the first portion PCL1 and the second portion PCL2, the insulating layer included in the circuit layer PCL may include a first portion and a second portion. For example, the planarization layer 117 (see FIG. 5) of the circuit layer PCL may include a first portion corresponding to the trench TR and a second portion around (e.g., surrounding) at least a portion of the first portion.

In one or more embodiments, a fourth vertical distance d4" from the upper surface of the substrate 100 to the upper surface of the first portion PCL1 of the circuit layer PCL may be less than a fifth vertical distance d5" from the upper surface of the substrate 100 to the upper surface of the second portion PCL2 of the circuit layer PCL. In other words, the thickness of the first portion PCL1 of the circuit layer PCL may be less than the thickness of the second portion PCL2 of the circuit layer PCL. In other words, the circuit layer PCL may include a trench corresponding to the trench TR of the pixel definition layer PDL.

The pixel definition layer PDL may include a first portion PDL1 corresponding to the trench TR, a second portion PDL2 corresponding to the groove GV, and a third portion PDL3 around (e.g., surrounding) at least a portion of the first portion PDL1 and the second portion PDL2. The third portion PDL3 may extend from the first portion PDL1 and the second portion PDL2. In one or more embodiments, the first portion PDL1 may be between the third portion PDL3 and the second portion PDL2.

In one or more embodiments, a first vertical distance d1" from the upper surface of the substrate 100 to the upper surface of the first portion PDL1 of the pixel definition layer PDL may be less than a second vertical distance d2" from the upper surface of the substrate 100 to the upper surface of the second portion PDL2 of the pixel definition layer PDL. The second vertical distance d2" may be less than a third vertical distance d3" from the upper surface of the substrate 100 to the upper surface of the third portion PDL3 of the pixel definition layer PDL.

Figure 8:
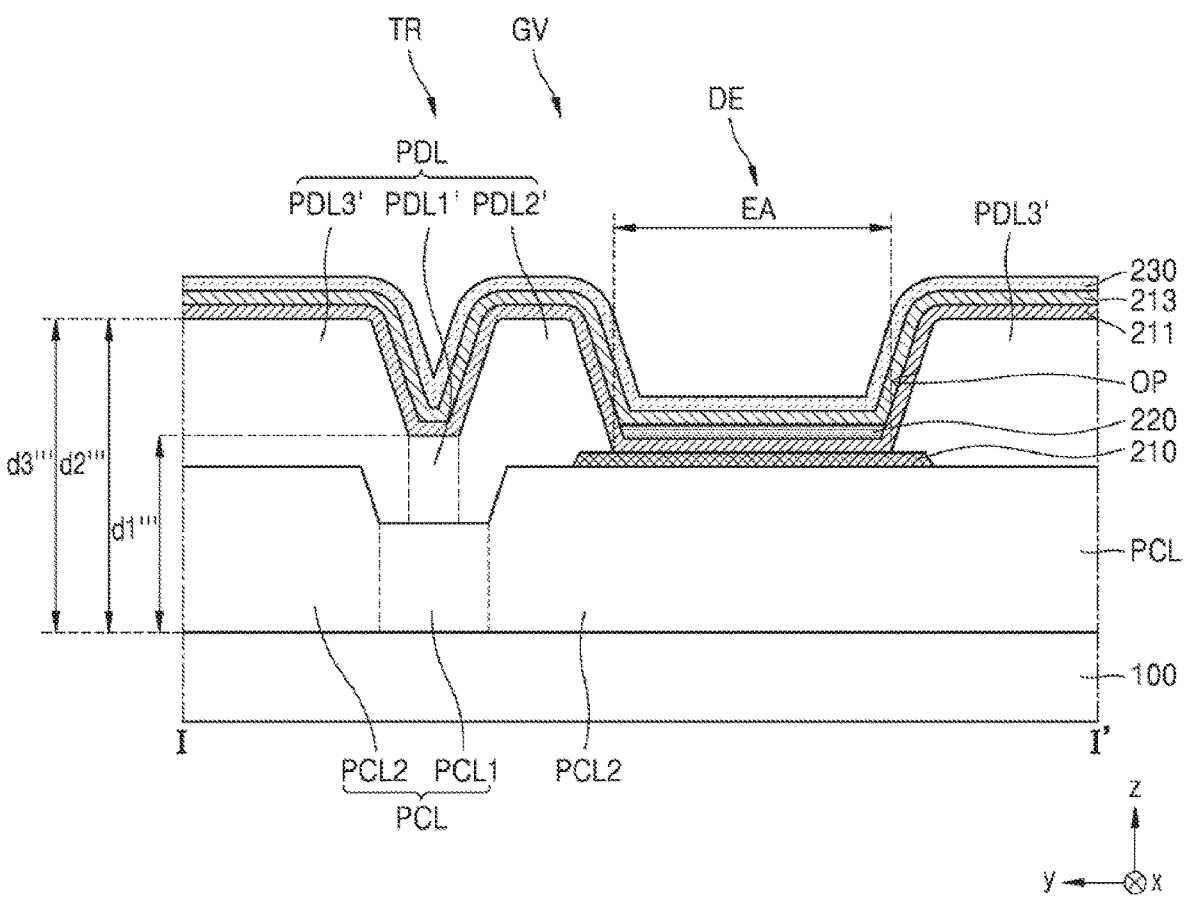
FIG. 8 is a cross-sectional view of a portion of the display apparatus taken along the line I-I' of FIG. 2.

FIG. 8 is a cross-sectional view of a portion of the display apparatus taken along the line I-I' of FIG. 2. FIG. 8 is a modification of FIG. 7 and may be different from FIG. 7 in terms of the structure of a pixel definition layer. Hereinafter, redundant descriptions thereof will not be repeated in view of the description of FIG. 7 and differences therebetween will be primarily described.

Referring to FIG. 8, the pixel definition layer PDL may include a first portion PDL1' corresponding to the trench TR, a second portion PDL2' corresponding to the groove GV, and a third portion PDL3' around (e.g., surrounding) at least a portion of the first portion PDL1' and the second portion PDL2'. The third portion PDL3' may extend from the first portion PDL1' and the second portion PDL2'.

In one or more embodiments, a first vertical distance d1'" from the upper surface of the substrate 100 to the upper surface of the first portion PDL1' of the pixel definition layer PDL may be less than a second vertical distance d2'" from the upper surface of the substrate 100 to the upper surface of the second portion PDL2' of the pixel definition layer PDL. The second vertical distance d2'" may be substantially equal to a third vertical distance d3'" from the upper surface of the substrate 100 to the upper surface of the third portion PDL3' of the pixel definition layer PDL. In one or more embodiments, the first vertical distance d1'", the second vertical distance d2'", and the third vertical distance d3'" may be measured in a thickness direction (e.g., ±z direction) of the substrate 100.

Figure 9:
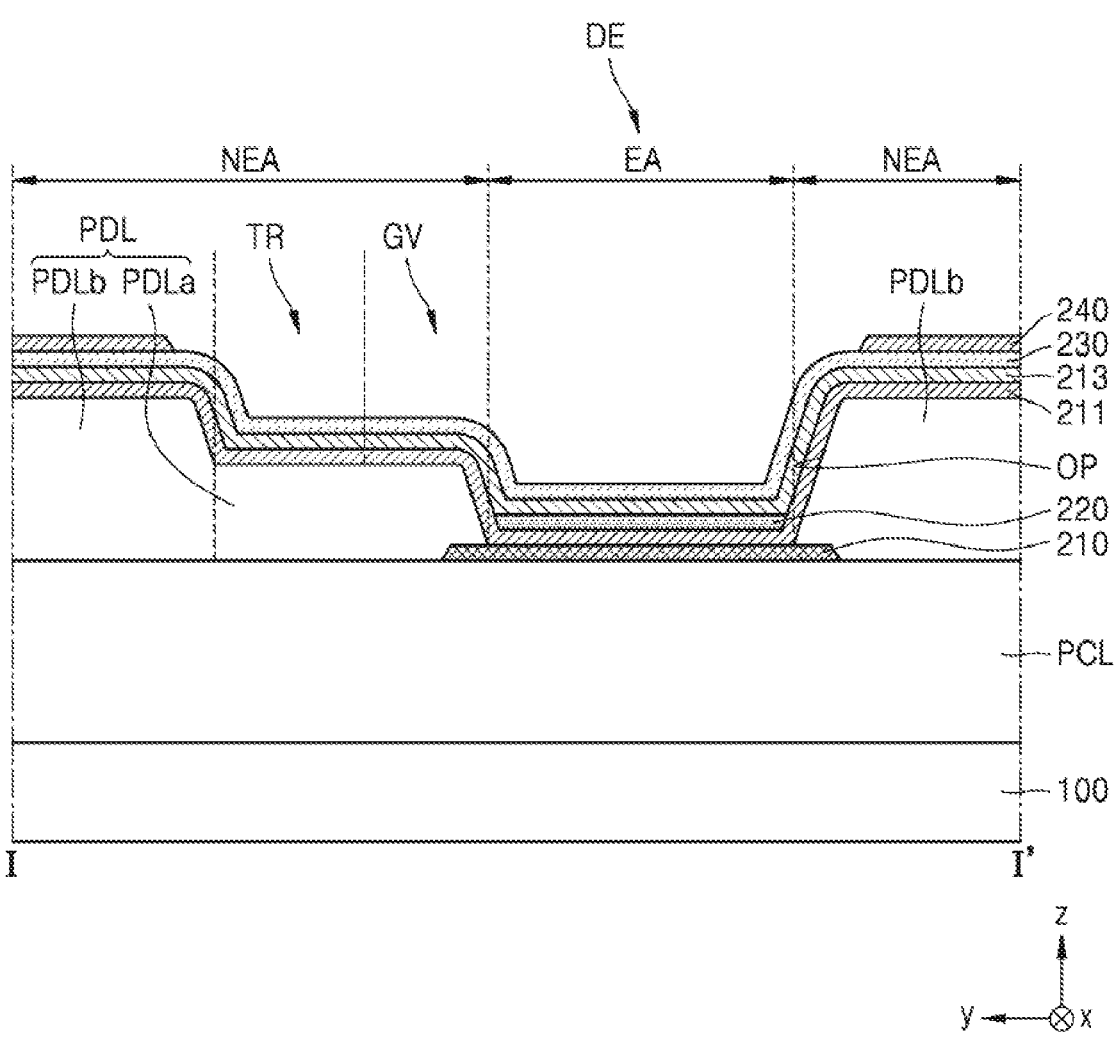
FIG. 9 is a cross-sectional view of a portion of the display apparatus taken along the line I-I' of FIG. 2.

FIG. 9 is a cross-sectional view of a portion of the display apparatus taken along the line I-I' of FIG. 2. FIG. 9 is a modification of FIG. 3 and may be different from FIG. 3 in terms of the structure of a resin layer. Hereinafter, redundant descriptions thereof will not be repeated in view of the description of FIG. 3 and differences therebetween will be primarily described.

Referring to FIG. 9, the display apparatus 1 may further include a resin layer 240 arranged in a non-emission area NEA. The non-emission area NEA may be defined as an area other than the emission area EA in the display area DA (see FIG. 1).

The resin layer 240 may be arranged on the opposite electrode 230. The resin layer 240 may not be arranged in the trench TR, the groove GV, and the opening OP as illustrated in FIG. 9. In other words, the resin layer 240 may not overlap the trench TR, the groove GV, and the opening OP in a thickness direction (e.g., ±z direction) of the substrate 100. In other words, the resin layer 240 may be around (e.g., may surround) at least a portion of the opening OP, the groove GV, and the trench TR.

As a comparative example, a resin layer may be arranged in an emission area. In this case, as described below, the resin layer may include an acid, and when the resin layer including the acid is arranged on an opposite electrode on the emission area, the acid of the resin layer may permeate through the surface of the opposite electrode, and as a result, the emission efficiency of the display element may be degraded or a lighting failure of the display element may occur.

However, when the resin layer 240 is arranged in the non-emission area NEA as in one or more embodiments, the emission efficiency degradation, the lighting failure, and/or the like of the display element DE due to the oxidation of the opposite electrode 230 on the emission area EA may be prevented or reduced.

The resin layer 240 may include a (thermo)setting resin, an acrylic resin, and/or the like. The resin layer 240 may include (or contain) an aging element. For example, the aging element may be an acrylic acid, a gas, and/or the like. The gas may be acid gas. The gas may be hydrogen gas (e.g., H+ gas).

Moreover, although not illustrated in FIG. 9, a capping layer may be arranged between the opposite electrode 230 and the resin layer 240. The capping layer may be configured to protect the opposite electrode 230 and may be configured to increase the light extraction efficiency. For example, the capping layer may include a material having a refractive index of about 1.2 to about 3.1. Also, the capping layer may include an organic material.

Figure 10:
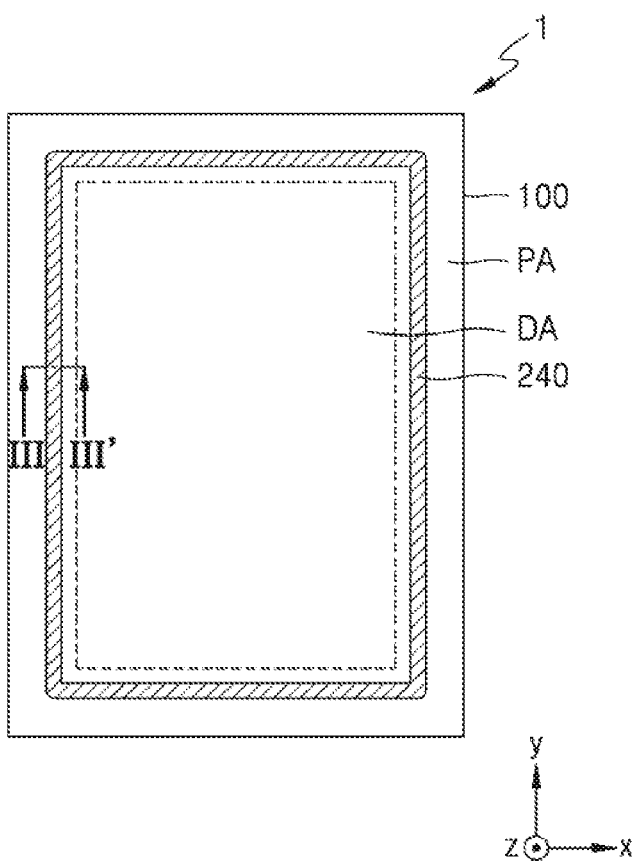
FIG. 10 is a plan view schematically illustrating a display apparatus according to one or more embodiments.
Figure 11:
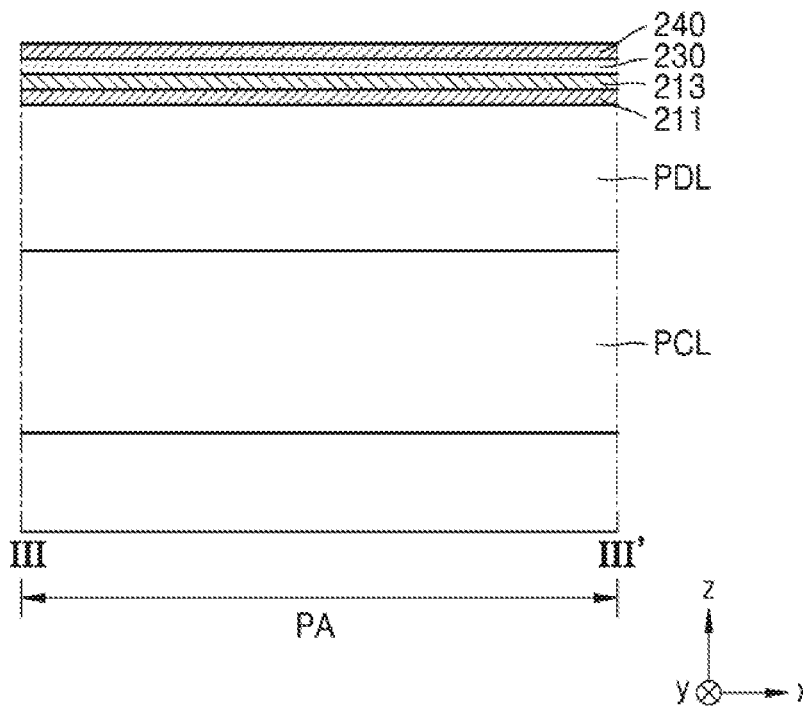
FIG. 11 is a cross-sectional view of a portion of the display apparatus taken along the line III-III' of FIG. 10.

FIG. 10 is a plan view schematically illustrating a display apparatus according to one or more embodiments, and FIG. 11 is a cross-sectional view of a portion of the display apparatus taken along the line III-III' of FIG. 10.

Referring to FIG. 10, unlike FIG. 9 described above, the resin layer 240 may be arranged in the peripheral area PA instead of in the display area DA. The resin layer 240 may surround at least a portion of the display area DA. As illustrated in FIG. 11, the resin layer 240 may be arranged on the opposite electrode 230. When the resin layer 240 is arranged in the peripheral area PA, the emission efficiency degradation, the lighting failure, and/or the like of the display element DE due to the oxidation of the opposite electrode 230 on the emission area EA may be prevented or reduced.

FIG. 10 illustrates that the resin layer 240 has a closed-loop shape around (e.g., surrounding) the display area DA; however, in another embodiment, the resin layer 240 may surround only a portion of the display area DA. For example, the resin layer 240 may have a first portion and a second portion spaced from each other, and the first portion of the resin layer 240 may be arranged on one side of the peripheral area PA and the second portion of the resin layer 240 may be arranged on the other side of the peripheral area PA.

Moreover, FIG. 9 illustrates that the resin layer 240 is arranged in the non-emission area NEA of the display area DA and FIGS. 10 and 11 illustrate that the resin layer 240 is arranged in the peripheral area PA; however, the resin layer 240 may be arranged in the non-emission area NEA of the display area DA and/or the peripheral area PA. For example, the resin layer 240 may be arranged in both the non-emission area NEA of the display area DA and the peripheral area PA.

Figure 12:
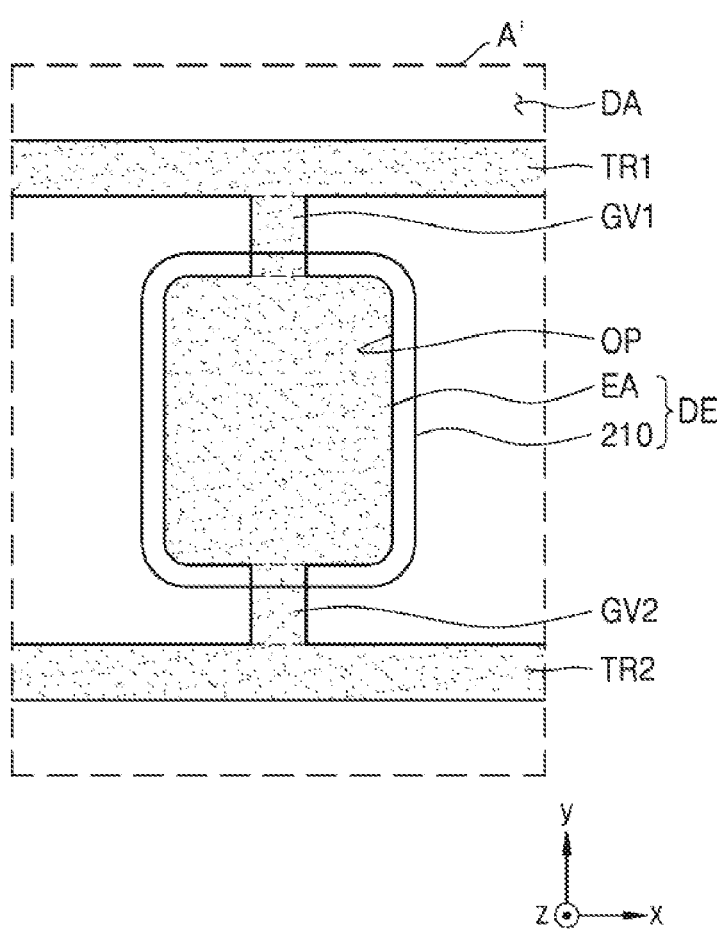
FIG. 12 is an enlarged plan view schematically illustrating a portion of a display apparatus according to one or more embodiments.

FIG. 12 is an enlarged plan view schematically illustrating a portion of a display apparatus according to one or more embodiments.

Referring to FIG. 12, the display apparatus 1 (see FIG. 1) may include a display element DE, an opening OP, a first trench TR1, a second trench TR2, a first groove GV1, and a second groove GV2 arranged in the display area DA.

The display element DE may include a pixel electrode 210 and an emission area EA that emits light. The display element DE may be a quantum-dot light emitting diode including a plurality of quantum dots 220q as described above with reference to FIG. 3.

The opening OP may define the emission area EA of the display element DE. As described above with reference to FIG. 3, the opening OP may be formed in the pixel definition layer PDL and may expose at least a portion of the pixel electrode 210.

The first trench TR1 and the second trench TR2 may be spaced from the opening OP in the first direction (e.g., ±y direction) and may extend in the second direction (e.g., ±x direction). The opening OP may be located between the first trench TR1 and the second trench TR2. The first trench TR1 and the second trench TR2 may be formed in the pixel definition layer PDL as described above with reference to FIG. 3.

The first groove GV1 may connect the opening OP to the first trench TR1. In other words, the first trench TR1 may be connected to the opening OP through the first groove GV1. The second groove GV2 may connect the opening OP to the second trench TR2. In other words, the second trench TR2 may be connected to the opening OP through the second groove GV2. The first groove GV1 and the second groove GV2 may be formed in the pixel definition layer PDL as described above with reference to FIG. 3.

The first trench TR1, the second trench TR2, the first groove GV1, and the second groove GV2 may function as a path for uniformly diffusing (or transmitting) an aging element (e.g., a gas) from the resin layer 240 described above with reference to FIGS. 9 to 11 to the opening OP. When the aging element reaches the opening OP, that is, the display element DE, a positive aging effect of the display element DE that is a quantum-dot light emitting diode may be promoted.

Figure 13:
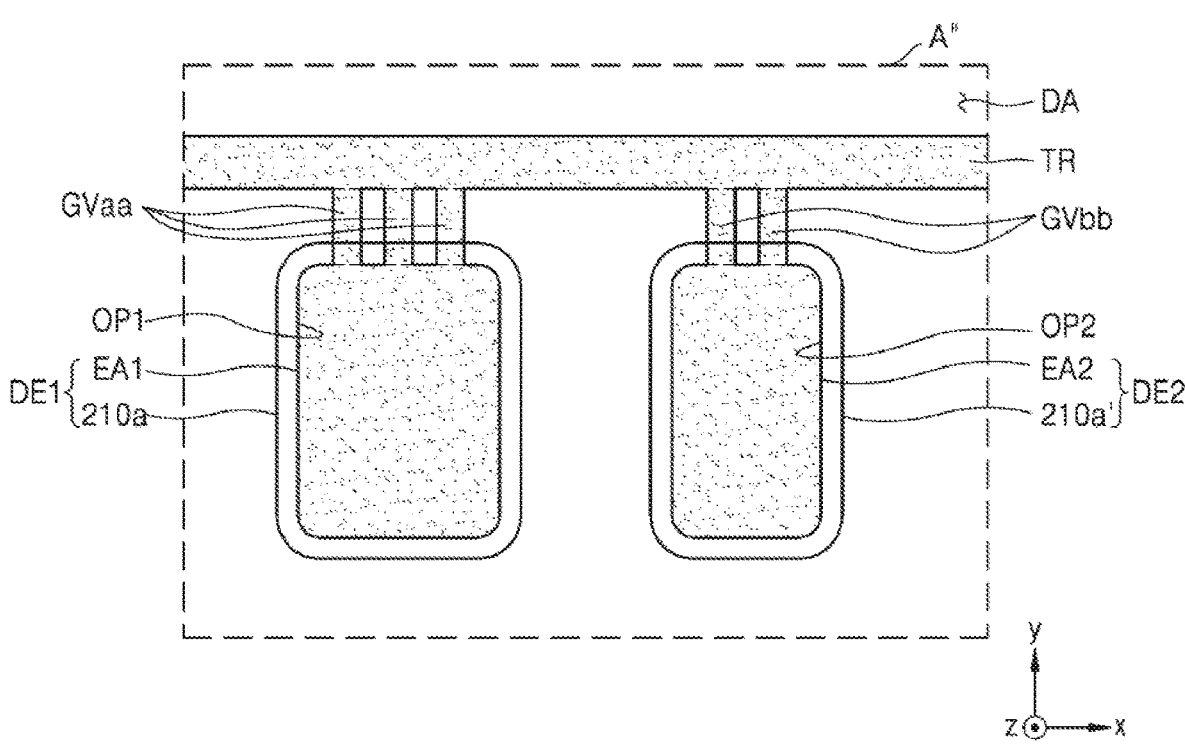
FIG. 13 is an enlarged plan view schematically illustrating a portion of a display apparatus according to one or more embodiments.

FIG. 13 is an enlarged plan view schematically illustrating a portion of a display apparatus according to one or more embodiments.

Referring to FIG. 13, the display apparatus 1 (see FIG. 1) may include a first display element DE1, a second display element DE2, a first opening OP1, a second opening OP2, a trench TR, a first groove GVaa, and a second groove GVbb arranged in the display area DA.

The first display element DE1 may include a first pixel electrode 210a and a first emission area EA1 from which light is emitted, and the second display element DE2 may include a second pixel electrode 210a' and a second emission area EA2 from which light is emitted. Each of the first display element DE1 and the second display element DE2 may be a quantum-dot light emitting diode including a plurality of quantum dots. In one or more embodiments, the first display element DE1 may be greater in size than the second display element DE2 in a plan view. Similarly, in one or more embodiments, the first emission area EA1 of the first display element DE1 may be greater in size than the second emission area EA2 of the second display element DE2 in a plan view.

In one or more embodiments, the first display element DE1 and the second display element DE2 may emit light of different colors. For example, the first display element DE1 may include a first emission layer including a plurality of first quantum dots and emitting light of a first color, and the second display element DE2 may include a second emission layer including a plurality of second quantum dots and emitting light of a second color. In this case, the size of the first quantum dots and the size of the second quantum dots may be different from each other. The description of the quantum dot 220q described above with reference to FIG. 3 may be similarly applied to the first quantum dots and the second quantum dots.

The first opening OP1 may define the first emission area EA1 of the first display element DE1, and the second opening OP2 may define the second emission area EA2 of the second display element DE2. The first opening OP1 and the second opening OP2 may be formed in the pixel definition layer PDL as described above with reference to FIG. 3 and may expose at least a portion of the first pixel electrode 210a and the second pixel electrode 210a', respectively.

The trench TR may be spaced from the first opening OP1 and the second opening OP2 in the first direction (e.g., ±y direction) and may extend in the second direction (e.g., ±x direction). The trench TR may be formed in the pixel definition layer PDL as described above with reference to FIG. 3.

The first groove GVaa may connect the first opening OP1 to the trench TR. In other words, the trench TR may be connected to the first opening OP1 through the first groove GVaa. The second groove GVbb may connect the second opening OP2 to the trench TR. In other words, the trench TR may be connected to the second opening OP2 through the second groove GVbb. The first groove GVaa and the second groove GVbb may be formed in the pixel definition layer PDL as described above with reference to FIG. 3.

In one or more embodiments, the groove may include a plurality of grooves, and the number of the plurality of grooves may be proportional to the size of the opening, that is, the size of the emission area. For example, as illustrated in FIG. 13, the first groove GVaa may include a plurality of first grooves GVaa and the second groove GVbb may include a plurality of second grooves GVbb. When the first opening OP1 is larger than the second opening OP2, that is, when the first emission area EA1 is larger than the second emission area EA2, the number of first grooves GVaa may be greater than the number of second grooves GVbb.

Although FIG. 13 illustrates that the number of first grooves GVaa is three (3) and the number of second grooves GVbb is two (2), this is merely an example, and embodiments of the present disclosure may be variously modified in any suitable manner.

Moreover, the trench TR, the first groove GVaa, and the second groove GVbb may function as a path for uniformly diffusing (or transmitting) an aging element (e.g., a gas) from the resin layer 240 described above with reference to FIGS. 9 to 11 to the first opening OP1 and the second opening OP2. Also, as illustrated in FIG. 13, when the number of grooves varies in proportion to the size of the opening, the aging element may be more uniformly diffused.

Figure 14:
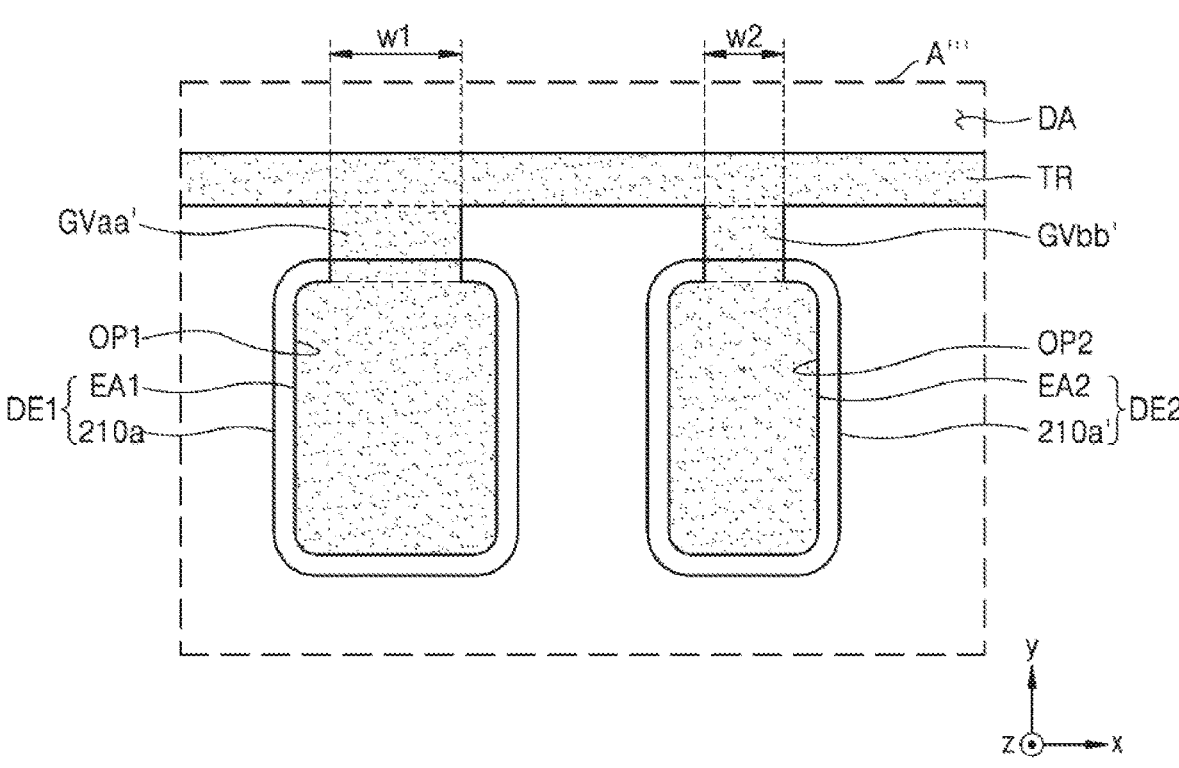
FIG. 14 is an enlarged plan view schematically illustrating a portion of a display apparatus according to one or more embodiments.

FIG. 14 is an enlarged plan view schematically illustrating a portion of a display apparatus according to one or more embodiments. FIG. 14 is a modification of FIG. 13 and may be different from FIG. 13 in terms of the structure of a groove. Hereinafter, redundant descriptions thereof will not be repeated in view of the description of FIG. 13 and differences therebetween will be primarily described.

Referring to FIG. 14, a first groove GVaa' may connect the first opening OP1 to the trench TR. In other words, the trench TR may be connected to the first opening OP1 through the first groove GVaa'. A second groove GVbb' may connect the second opening OP2 to the trench TR. In other words, the trench TR may be connected to the second opening OP2 through the second groove GVbb'. The first groove GVaa' and the second groove GVbb' may be formed in the pixel definition layer PDL as described above with reference to FIG. 3.

In one or more embodiments, the width of the groove in the second direction (e.g., ±x direction) may be proportional to the size of the opening, that is, the size of the emission area. For example, as illustrated in FIG. 14, when the first opening OP1 is larger than the second opening OP2, that is, when the first emission area EA1 is larger than the second emission area EA2, a first width w1 of the first groove GVaa' in the second direction (e.g., ±x direction) may be greater than a second width w2 of the second groove GVbb' in the second direction (e.g., ±x direction).

Moreover, the trench TR, the first groove GVaa', and the second groove GVbb' may function as a path for uniformly diffusing (or transmitting) an aging element (e.g., a gas) from the resin layer 240 described above with reference to FIGS. 9 to 11 to the first opening OP1 and the second opening OP2. Also, as illustrated in FIG. 14, when the width of the groove varies in proportion to the size of the opening, the aging element may be more uniformly diffused.

Figure 15:
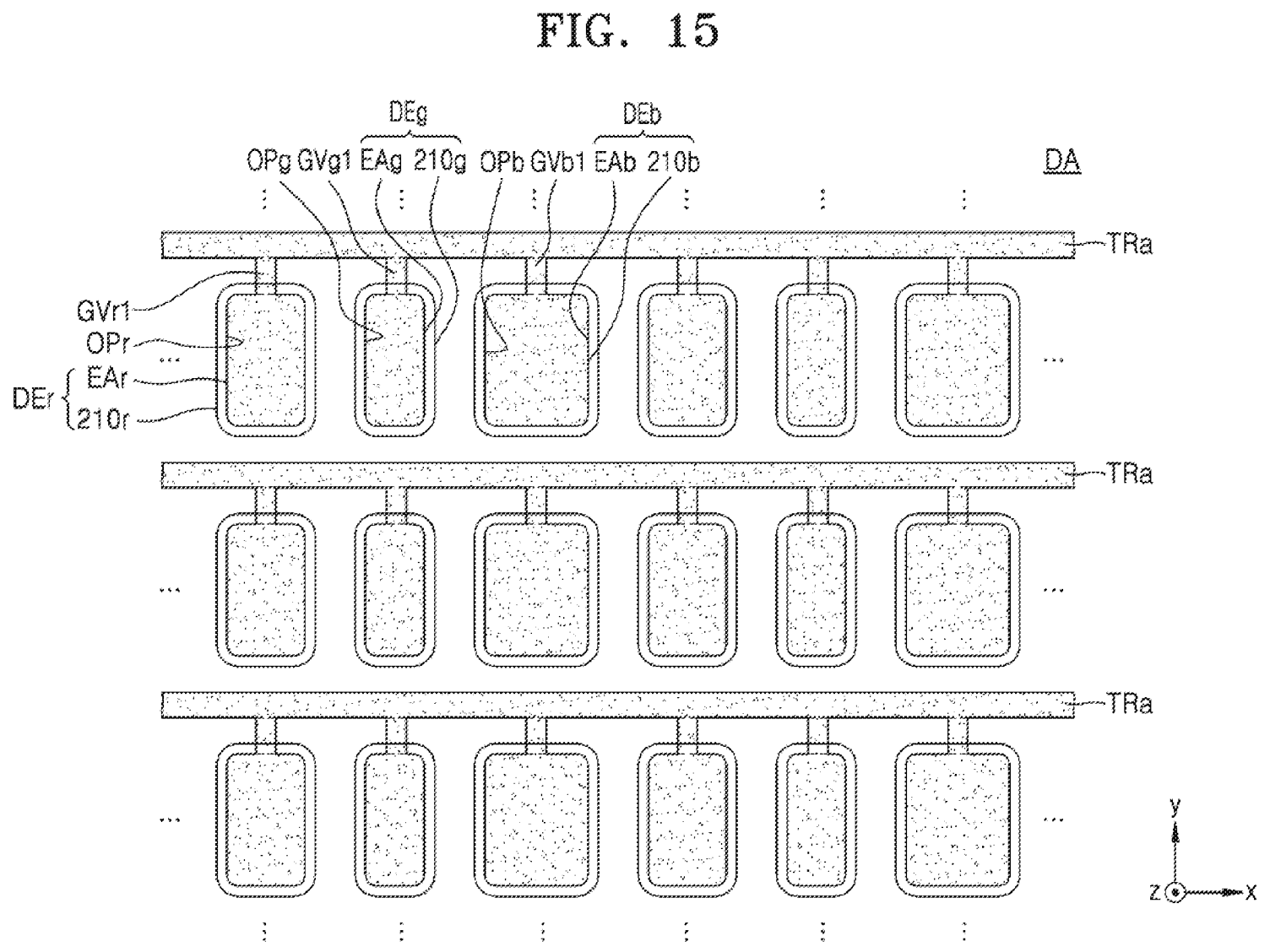

FIG. 15 is an enlarged plan view schematically illustrating a portion of a display apparatus according to one or more embodiments.

Referring to FIG. 15, the display apparatus 1 (see FIG. 1) may include first display elements DEr, second display elements DEg, third display elements DEb, first openings OPr, second openings OPg, third openings OPb, first trenches TRa, first grooves GVr1, second grooves GVg1, and third grooves GVb1 arranged in the display area DA.

The first display elements DEr, the second display elements DEg, and the third display elements DEb may be arranged in a matrix in the first direction (e.g., ±y direction) and the second direction (e.g., ±x direction). Each of the first display elements DEr may include a first pixel electrode 210r and a first emission area EAr from which light is emitted, each of the second display elements DEg may include a second pixel electrode 210g and a second emission area EAg from which light is emitted, and each of the third display elements DEb may include a third pixel electrode 210b and a third emission area EAb from which light is emitted. Each of the first display elements DEr, the second display elements DEg, and the third display elements DEb may be a quantum-dot light emitting diode including a plurality of quantum dots.

In one or more embodiments, the first display elements DEr, the second display elements DEg, and the third display elements DEb may emit light of different colors. For example, each of the first display elements DEr may include a first emission layer including a plurality of first quantum dots and emitting light of a first color, each of the second display elements DEg may include a second emission layer including a plurality of second quantum dots and emitting light of a second color, and each of the third display elements DEb may include a third emission layer including a plurality of third quantum dots and emitting light of a third color.

In this case, the size of the first quantum dots, the size of the second quantum dots, and the size of the third quantum dots may be different from each other. For example, when the first color is red, the second color is green, and the third color is blue, the first quantum dots may be largest and the third quantum dots may be smallest. For example, the size of the first quantum dots may be larger than the size of the second quantum dots, and the size of the second quantum dots may be larger than the size of the third quantum dots. The description of the quantum dot 220q described above with reference to FIG. 3 may be similarly applied to the first quantum dots, the second quantum dots, and the third quantum dots.

The first openings OPr may respectively define the first emission areas EAr of the first display elements DEr, the second openings OPg may respectively define the second emission area EAg of the second display elements DEg, and the third openings OPb may respectively define the third emission areas EAb of the third display elements DEb. The first openings OPr, the second openings OPg, and the third openings OPb may be formed in the pixel definition layer PDL as described above with reference to FIG. 3 and may expose at least a portion of the first pixel electrode 210r, the second pixel electrodes 210g, and the third pixel electrodes 210b, respectively.

The first trenches TRa may be spaced from the first openings OPr, the second openings OPg, and the third openings OPb in the first direction (e.g., ±y direction) and may extend in the second direction (e.g., ±x direction). The first trench TRa may be formed in the pixel definition layer PDL as described above with reference to FIG. 3.

The first trenches TRa may be located between rows of the first display elements DEr. Although the description has been based on the first display element DEr, the description may be similarly applied to the second display element DEg and the third display element DEb. For example, the first trenches TRa may be located between rows of the second display elements DEg. The first trenches TRa may be located between rows of the third display elements DEb.

The first grooves GVr1 may connect the first openings OPr to the first trenches TRa, the second grooves GVg1 may connect the second openings OPg to the first trenches TRa, and the third grooves GVb1 may connect the third openings OPb to the first trenches TRa. In other words, the first trenches TRa may be connected to the first openings OPr through the first grooves GVr1, may be connected to the second openings OPg through the second grooves GVg1, and may be connected to the third openings OPb through the third grooves GVb1. The first grooves GVr1, the second grooves GVg1, and the third grooves GVb1 may be formed in the pixel definition layer PDL as described above with reference to FIG. 3.

Figure 23:
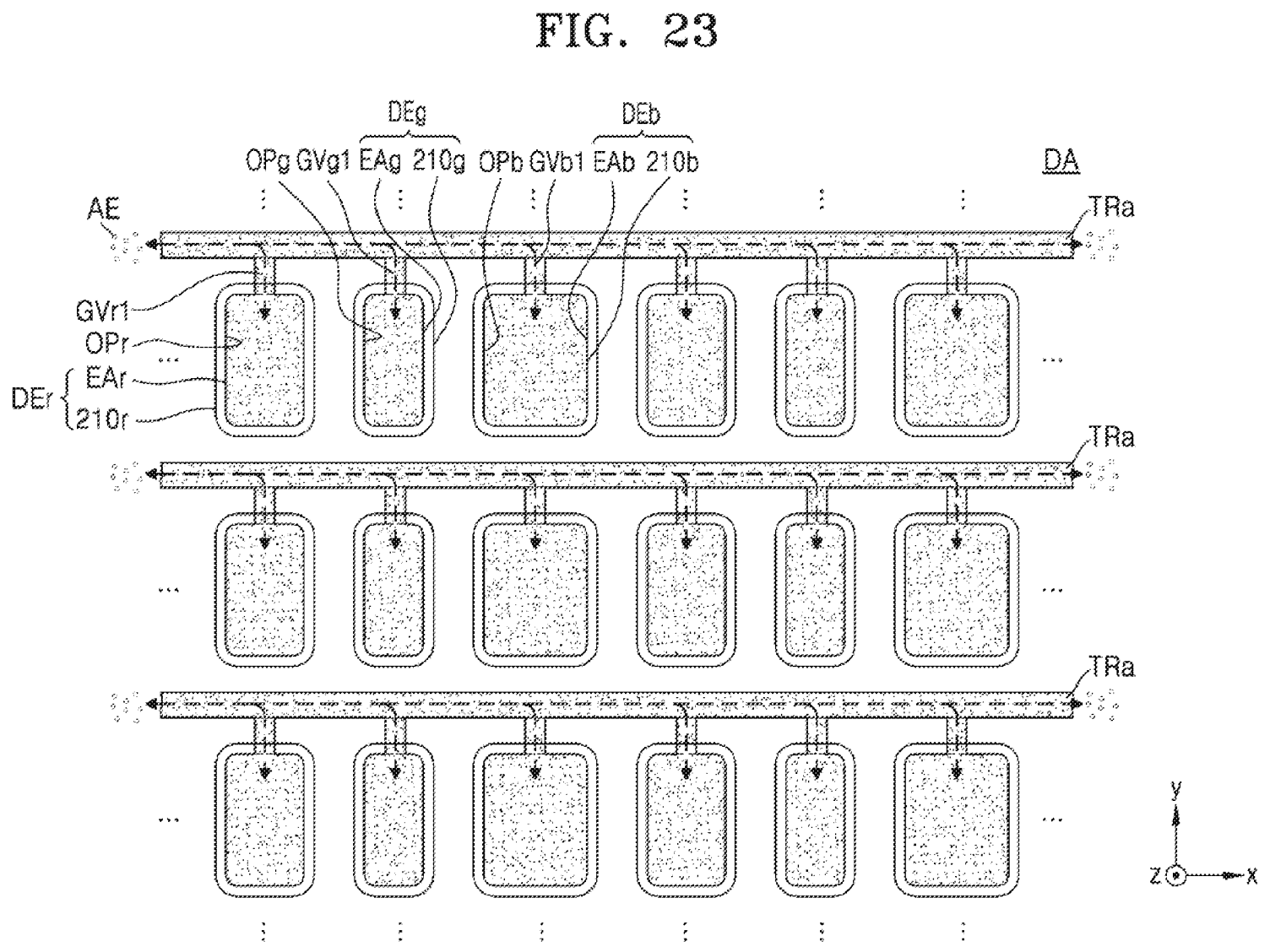

Moreover, the first trenches TRa, the first grooves GVr1, the second grooves GVg1, and the third grooves GVb1 may function as a path for uniformly diffusing (or transmitting) the aging element AE (e.g., a gas) from the resin layer 240 (see FIG. 9) to the first openings OPr, the second openings OPg, and the third openings OPb as illustrated in FIG. 23 described below.

Figure 16:
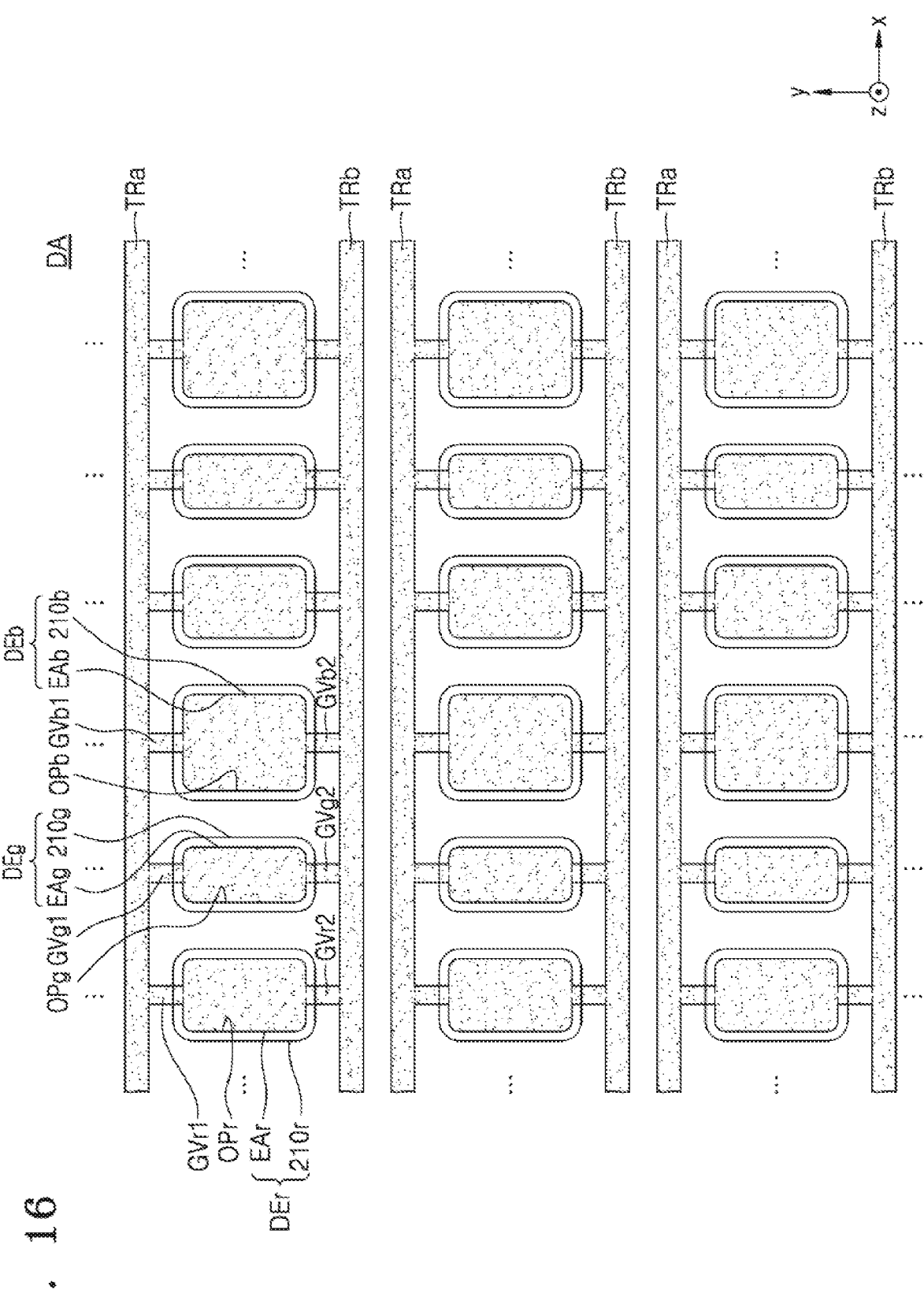
FIG. 16 is an enlarged plan view schematically illustrating a portion of a display apparatus according to one or more embodiments.

FIG. 16 is an enlarged plan view schematically illustrating a portion of a display apparatus according to one or more embodiments. FIG. 16 is a modification of FIG. 15 and may be different from FIG. 15 in terms of the structure of a trench and a groove. Hereinafter, redundant descriptions thereof will not be repeated in view of the description of FIG. 15 and differences therebetween will be primarily described.

Referring to FIG. 16, the display apparatus 1 (see FIG. 1) may further include second trenches TRb, fourth grooves GVr2, fifth grooves GVg2, and sixth grooves GVb2 arranged in the display area DA.

The second trenches TRb may be spaced from the first openings OPr, the second openings OPg, and the third openings OPb in the first direction (e.g., ±y direction) and may extend in the second direction (e.g., ±x direction). The first openings OPr, the second openings OPg, and the third openings OPb may be located between the first trench TRa and the second trench TRb. The second trench TRb may be formed in the pixel definition layer PDL as described above with reference to FIG. 3.

The second trenches TRb may be located between rows of the first display elements DEr. Although the description has been based on the first display element DEr, the description may be similarly applied to the second display element DEg and the third display element DEb. For example, the second trenches TRb may be located between rows of the second display elements DEg. The second trenches TRb may be located between rows of the third display elements DEb.

The fourth grooves GVr2 may connect the first openings OPr to the second trenches TRb, the fifth grooves GVg2 may connect the second openings OPg to the second trenches TRb, and the sixth grooves GVb2 may connect the third openings OPb to the second trenches TRb. In other words, the second trenches TRb may be connected to the first openings OPr through the fourth grooves GVr2, may be connected to the second openings OPg through the fifth grooves GVg2, and may be connected to the third openings OPb through the sixth grooves GVb2. The fourth grooves GVr2, the fifth grooves GVg2, and the sixth grooves GVb2 may be formed in the pixel definition layer PDL as described above with reference to FIG. 3.

Moreover, like the first trenches TRa, the first grooves GVr1, the second grooves GVg1, and the third grooves GVb1, the second trenches TRb, the fourth grooves GVr2, the fifth grooves GVg2, and the sixth grooves GVb2 may function as a path for uniformly diffusing (or transmitting) an aging element (e.g., a gas) to the first openings OPr, the second openings OPg, and the third opening OPb.

Figure 17:
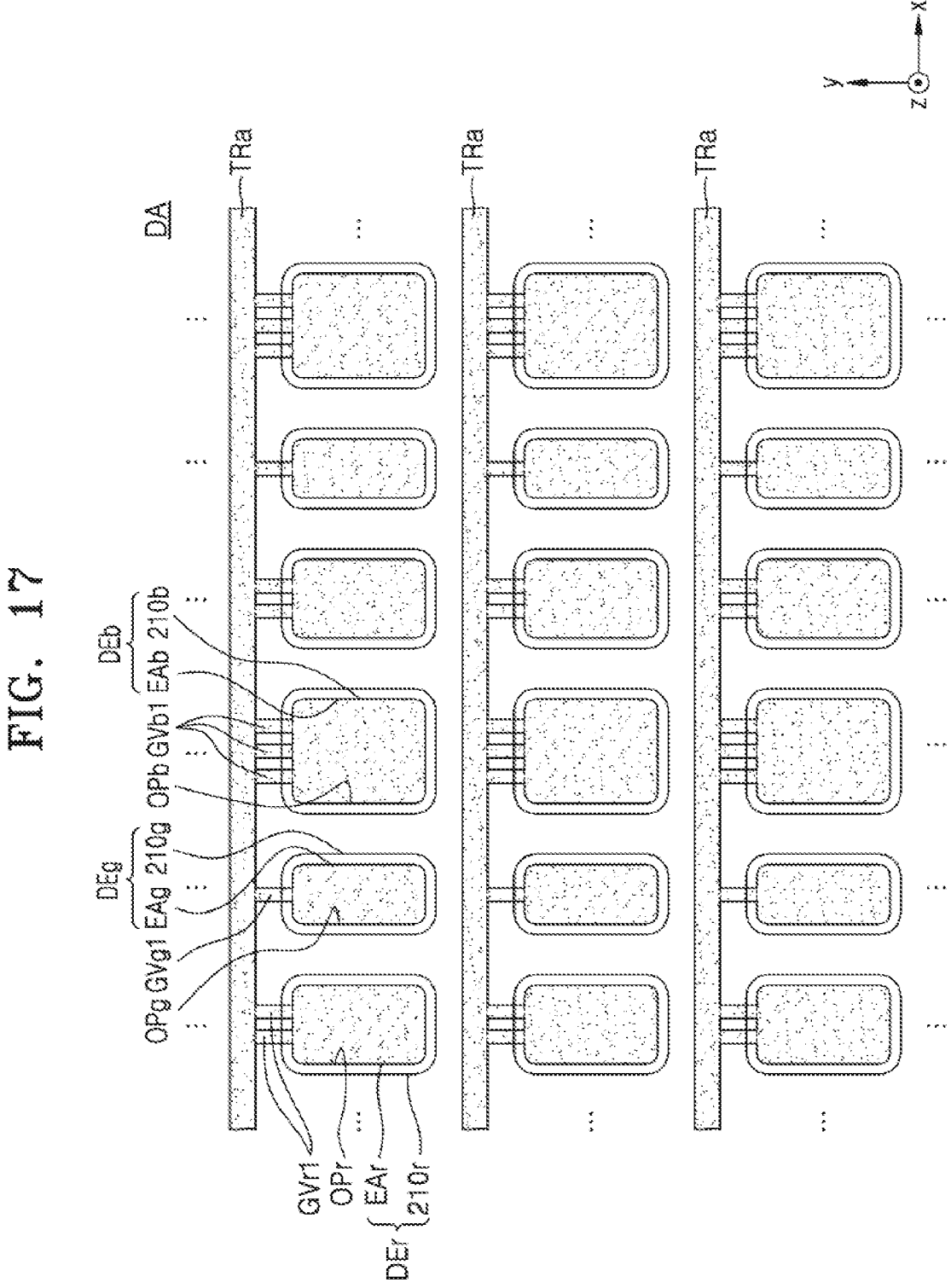
FIG. 17 is an enlarged plan view schematically illustrating a portion of a display apparatus according to one or more embodiments.

FIG. 17 is an enlarged plan view schematically illustrating a portion of a display apparatus according to one or more embodiments. FIG. 17 is a modification of FIG. 15 and may be different from FIG. 15 in terms of the structure of a groove. Hereinafter, redundant descriptions thereof will not be repeated in view of the description of FIG. 15 and differences therebetween will be primarily described.

Referring to FIG. 17, the number of grooves may be proportional to the size of the opening, that is, the size of the emission area. For example, as illustrated in FIG. 17, when the first opening OPr is larger than the second opening OPg, that is, when the first emission area EAr is larger than the second emission area EAg, the number of first grooves GVr1 may be greater than the number of second grooves GVg1. When the third opening OPb is larger than the first opening OPr, that is, when the third emission area EAb is larger than the first emission area EAr, the number of third grooves GVb1 may be greater than the number of first grooves GVr1.

Although FIG. 17 illustrates that the number of first grooves GVr1 is two (2), the number of second grooves GVg1 is one (1), and the number of third grooves GVb1 is 3, this is merely an example and embodiments of the present disclosure may be variously modified in any suitable manner.

As such, as illustrated in FIG. 17, when the number of grooves varies in proportion to the size of the opening, the aging element may be more uniformly diffused to the display elements.

Figure 18:
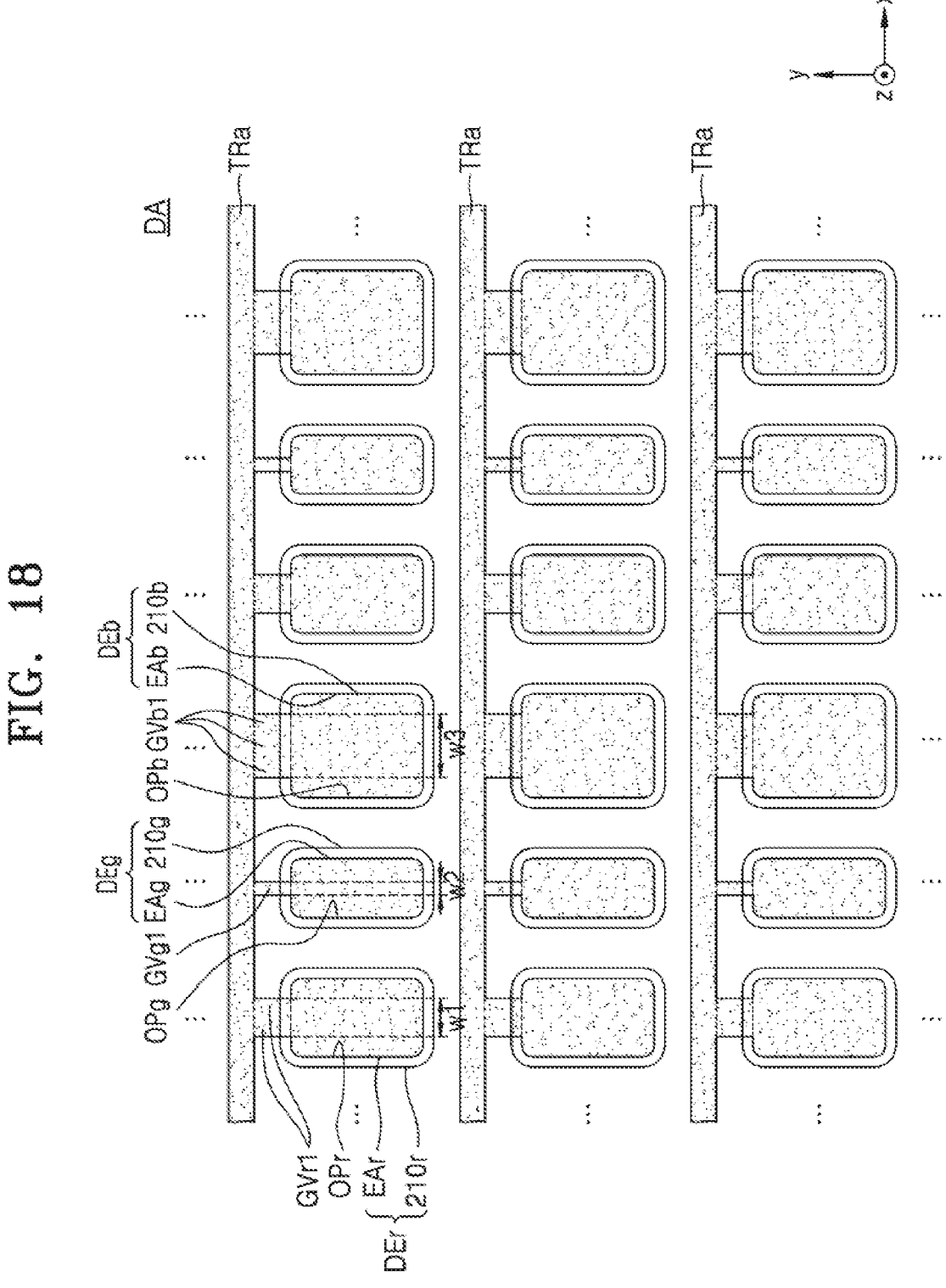
FIG. 18 is an enlarged plan view schematically illustrating a portion of a display apparatus according to one or more embodiments.

FIG. 18 is an enlarged plan view schematically illustrating a portion of a display apparatus according to one or more embodiments. FIG. 18 is a modification of FIG. 15 and may be different from FIG. 15 in terms of the structure of a groove. Hereinafter, redundant descriptions thereof will not be repeated in view of the description of FIG. 15 and differences therebetween will be primarily described.

Referring to FIG. 18, the width of the groove in the second direction (e.g., ±x direction) may be proportional to the size of the opening, that is, the size of the emission area. For example, as illustrated in FIG. 18, when the first opening OPr is larger than the second opening OPg, that is, when the first emission area EAr is larger than the second emission area EAg, a first width w1 of the first groove GVr1 in the second direction (e.g., ±x direction) may be greater than a second width w2 of the second groove GVg1 in the second direction (e.g., ±x direction). When the third opening OPb is larger than the first opening OPr, that is, when the third emission area EAb is larger than the first emission area EAr, a third width w3 of the third groove GVb1 in the second direction (e.g., ±x direction) may be greater than the first width w1 of the first groove GVr1 in the second direction (e.g., the ±x direction).

As such, as illustrated in FIG. 18, when the width of grooves varies in proportion to the size of the opening, the aging element may be more uniformly diffused to the display elements.

Although only the display apparatus has been primarily described above, the present disclosure is not limited thereto. For example, a display apparatus manufacturing method for manufacturing the display apparatus may also be within the scope of the present disclosure.

FIGS. 19 to 23 are diagrams for describing a method of manufacturing a display apparatus, according to one or more embodiments.

Figure 19:
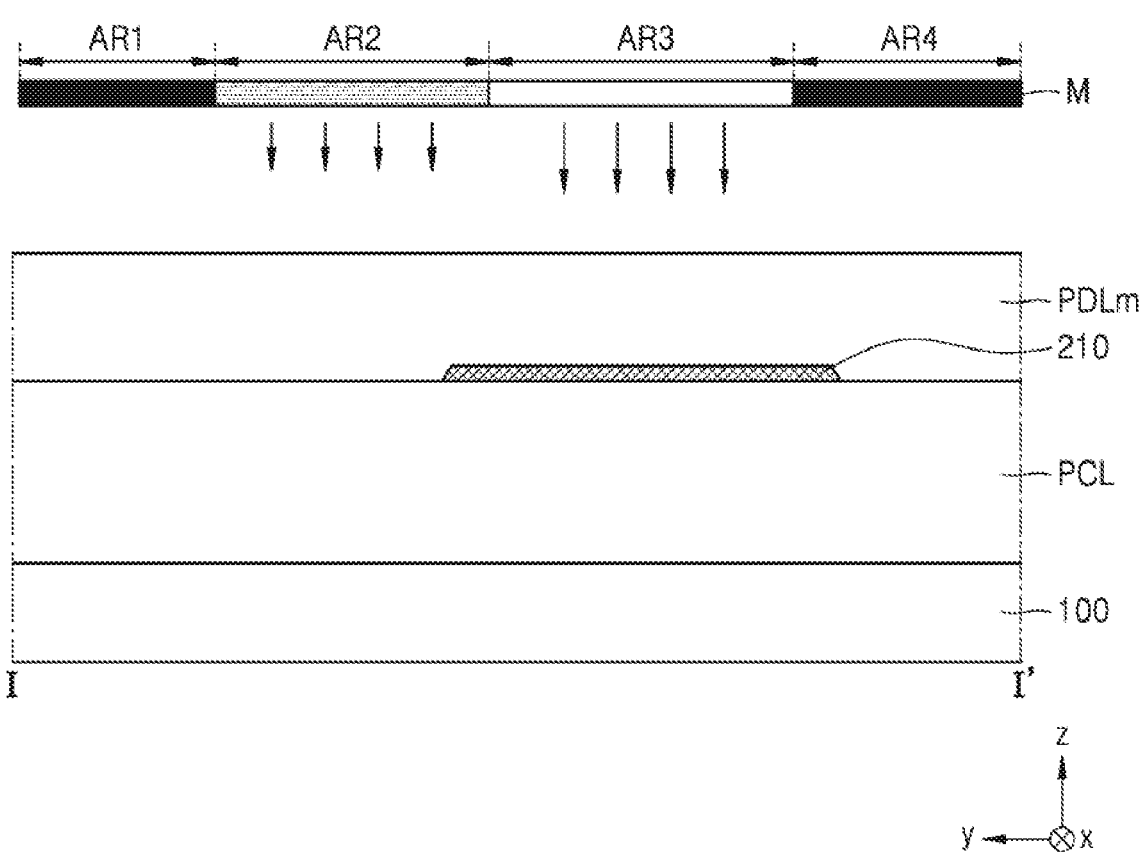

First, referring to FIG. 19, a circuit layer PCL and a pixel electrode 210 may be sequentially formed on a substrate 100. The pixel electrode 210 may be formed by depositing a pixel electrode material layer and performing a mask process and an etching process. For example, the etching process may be wet etching.

After the pixel electrode 210 is formed, an insulating material layer PDLm may be formed on the pixel electrode 210. The insulating material layer PDLm may include a positive photoresist, and the insulating material layer PDLm may be formed by applying a positive photoresist solution onto the pixel electrode 210 by various methods such as spin coating, spraying, or dipping.

A mask M may be arranged on the insulating material layer PDLm. The mask M may control the light exposure amount to the insulating material layer PDLm for each area. For example, a first area AR1 and a fourth area AR4 of the mask M may be shielded such that the insulating material layer PDLm may not be exposed to light. A second area AR2 of the mask M may be adjusted to provide a smaller light exposure amount to the insulating material layer PDLm than a third area AR3 of the mask M. For example, the mask M may be a half-tone mask or a slit mask.

The insulating material layer PDLm may be exposed at a different light exposure amount for each area through the mask M, and a portion of the insulating material layer PDLm may be removed through a development process. Because the amount of the insulating material layer PDLm removed is different according to the light exposure amount, a pixel definition layer PDL having a different thickness for each area may be formed at once.

Figure 20:
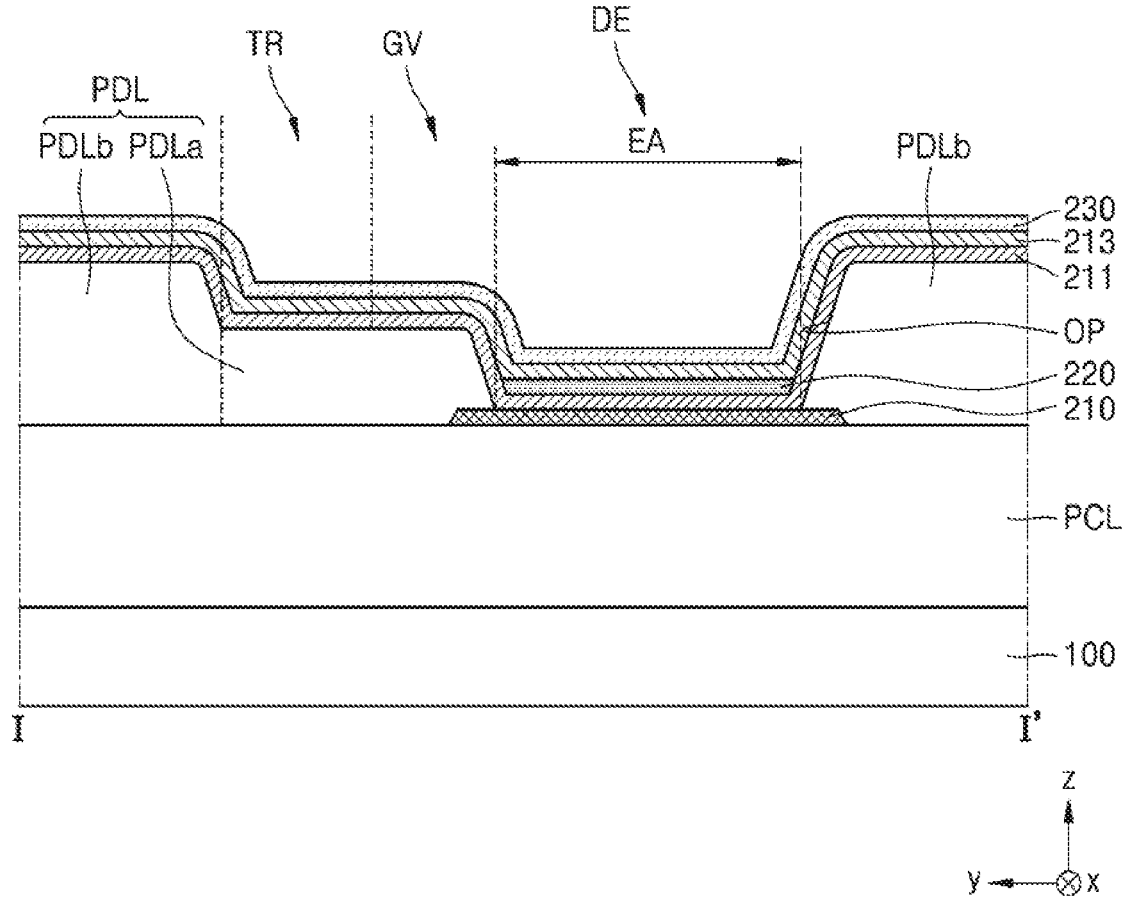

For example, as illustrated in FIG. 20, the pixel definition layer PDL may include a first portion PDLa and a second portion PDLb around (e.g., surrounding) at least a portion of the first portion PDLa. The first portion PDLa may correspond to a portion from which the insulating material layer PDLm is not removed because the insulating material layer PDLm is not exposed by the first area AR1 and the fourth area AR4 of the mask M. The second portion PDLb may correspond to a portion from which the insulating material layer PDLm is partially removed because a controlled light exposure amount is applied to the insulating material layer PDLm by the second area AR2 of the mask M. The first portion PDLa may be thicker than the second portion PDLb.

Due to the thickness difference between the first portion PDLa and the second portion PDLb, a step may be formed on the upper surface of the pixel definition layer PDL, and a trench TR and a groove GV may be formed. The second portion PDLb may correspond to the trench TR and the groove GV.

Moreover, a portion of the insulating material layer PDLm corresponding to the third area AR3 of the mask M may be entirely removed, and an opening OP exposing at least a portion of the pixel electrode 210 may be formed.

Although FIG. 19 illustrates that the insulating material layer PDLm includes a positive photoresist, the insulating material layer PDLm may include a negative photoresist. In this case, as opposed to when the insulating material layer PDLm includes a positive photoresist, the thickness of the insulating material layer PDLm remaining after the development process may increase as the light exposure amount to the insulating material layer PDLm increases.

Referring back to FIG. 20, after the pixel definition layer PDL is formed, a first functional layer 211, an emission layer 220, a second functional layer 213, and an opposite electrode 230 may be sequentially formed. The emission layer 220 may be formed in the opening OP, and the first functional layer 211, the second functional layer 213, and the opposite electrode 230 may be formed such that at least a portion thereof may be arranged in the opening OP, the trench TR, and the groove GV.

The first functional layer 211, the second functional layer 213, and the opposite electrode 230 may be formed to cover the substrate 100 through an open mask. The first functional layer 211, the second functional layer 213, and the opposite electrode 230 may be formed by a deposition method such as chemical vapor deposition (CVD), plasma enhanced CVD (PECVD), low pressure CVD (LPCVD), physical vapor deposition (PVD), sputtering, or atomic layer deposition (ALD).

The emission layer 220 may be formed by an inkjet method (or an inkjet printing method). In other embodiments, the emission layer 220 may be formed by vacuum deposition, screen printing, laser induced thermal imaging (LITI), and/or the like.

Figure 21:
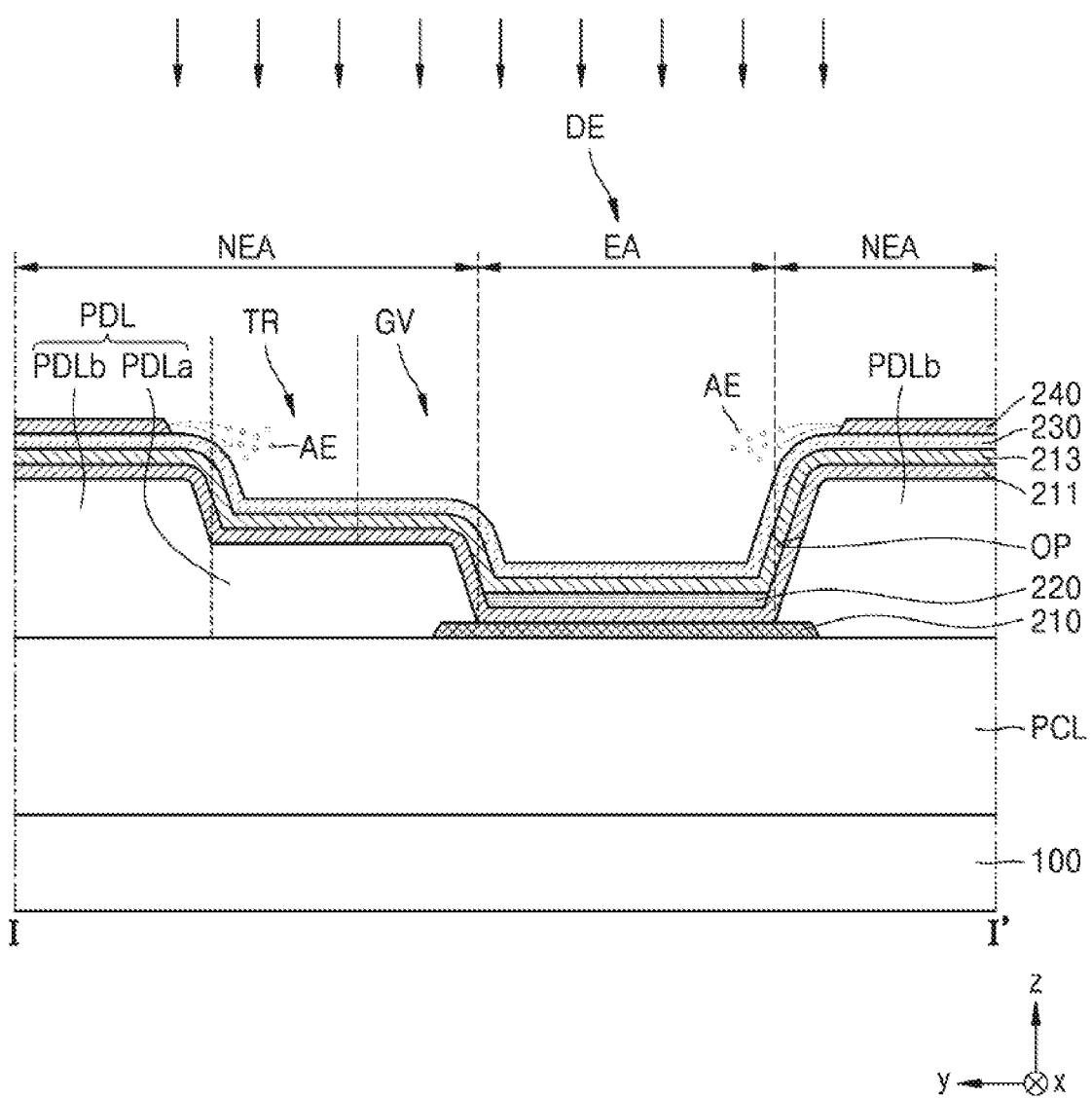

Next, referring to FIG. 21, a resin layer 240 may be formed (or applied) on the opposite electrode 230. The resin layer 240 may be formed in the non-emission area NEA of the display area DA (see FIG. 1) as illustrated in FIG. 21, may be formed in the peripheral area PA as illustrated in FIG. 10 described above, or may be formed in both the non-emission area NEA of the display area DA and the peripheral area PA. The resin layer 240 may include (or contain) an aging element AE. For example, the aging element AE may be an acrylic acid, gas, and/or the like. The gas may be acid gas. The gas may be hydrogen gas (e.g., an H+ gas).

After the resin layer 240 is formed, the resin layer 240 may be annealed. When the resin layer 240 is annealed, the aging element AE may be diffused (or dispersed) from the resin layer 240. The aging element AE diffused (or dispersed) from the resin layer 240 may reach a display element DE, and a positive aging effect of the display element DE may be promoted. For example, the aging element AE may fill an oxygen-defective portion of the second functional layer 213, and as a result, a driving voltage for driving the display element DE may decrease and the efficiency of a driving current may increase.

Figure 22:
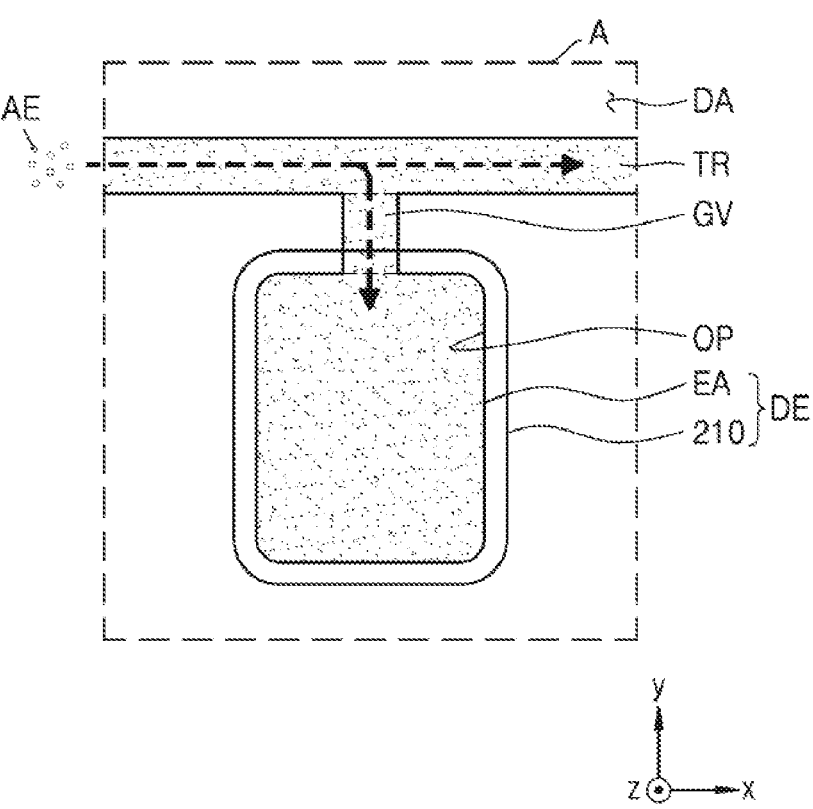

The display apparatus 1 (see FIG. 1) according to one or more embodiments may include a trench TR and a groove GV as illustrated in FIG. 22, and the aging element AE may be transmitted to the opening OP through the groove GV while moving along the trench TR. The aging element AE may reach the opening OP along the trench TR and the groove GV.

As illustrated in FIG. 23, even when a plurality of display elements are arranged in a matrix in the display area DA, the aging element AE may be uniformly diffused through the first trenches TRa, the first grooves GVr1, the second grooves GVg1, and the third grooves GVb1 regardless of the arrangement position of the display elements. Even when the resin layer 240 is arranged in the non-emission area NEA of the display area DA and/or the peripheral area PA, the aging element AE may be uniformly diffused (or transmitted) to the display elements through the first trenches TRa, the first grooves GVr1, the second grooves GVg1, and the third grooves GVb1.

Moreover, as described above with reference to FIG. 3, an encapsulation substrate may be arranged to face the substrate 100. A process of annealing the resin layer 240 may be performed after the encapsulation substrate is formed.

Figure 24:
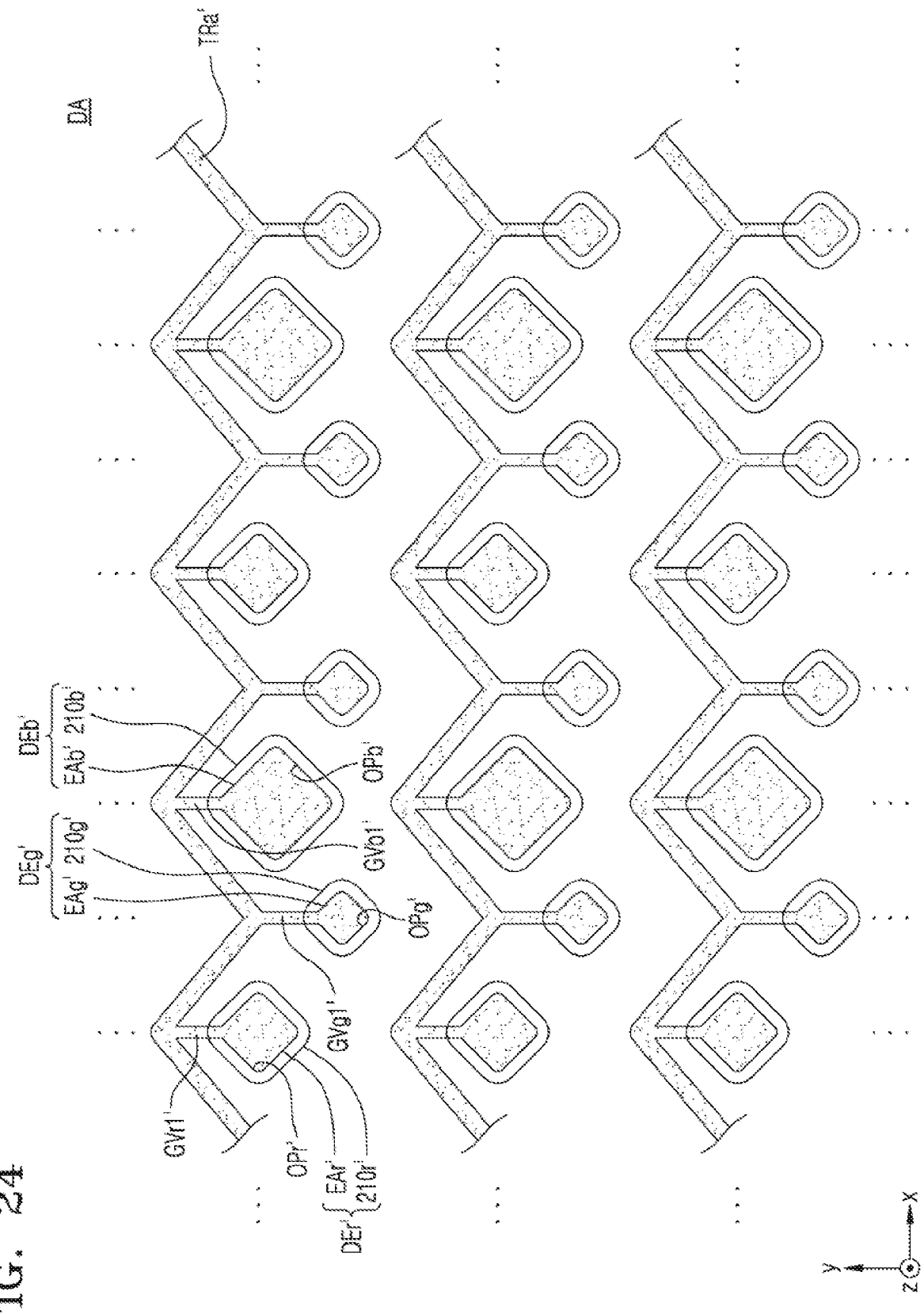
FIG. 24 is an enlarged plan view schematically illustrating a portion of a display apparatus according to one or more embodiments.

FIG. 24 is an enlarged plan view schematically illustrating a portion of a display apparatus according to one or more embodiments.

Referring to FIG. 24, the display apparatus 1 (see FIG. 1) may include first display elements DEr', second display elements DEg', third display elements DEb', first openings OPr', second openings OPg', third openings OPb', first trenches TRa', first grooves GVr1', second grooves GVg1', and third grooves GVb1' arranged in the display area DA.

The first display elements DEr', the second display elements DEg', and the third display elements DEb' may be arranged in a PENTILE® type/structure (e.g., an RGBG type/structure). Each of the first display elements DEr' may include a first pixel electrode 210r' and a first emission area EAr' from which light is emitted, each of the second display elements DEg' may include a second pixel electrode 210g' and a second emission area EAg' from which light is emitted, and each of the third display elements DEb' may include a third pixel electrode 210b' and a third emission area EAb' from which light is emitted. Each of the first display elements DEr', the second display elements DEg', and the third display elements DEb' may be a quantum-dot light emitting diode including a plurality of quantum dots.

In one or more embodiments, the first display elements DEr', the second display elements DEg', and the third display elements DEb' may emit light of different colors. For example, each of the first display elements DEr' may include a first emission layer including a plurality of first quantum dots and emitting light of a first color, each of the second display elements DEg' may include a second emission layer including a plurality of second quantum dots and emitting light of a second color, and each of the third display elements DEb' may include a third emission layer including a plurality of third quantum dots and emitting light of a third color.

In this case, the size of the first quantum dots, the size of the second quantum dots, and the size of the third quantum dots may be different from each other. For example, when the first color is red, the second color is green, and the third color is blue, the first quantum dots may be largest and the third quantum dots may be smallest. For example, the size of the first quantum dots may be larger than the size of the second quantum dots, and the size of the second quantum dots may be larger than the size of the third quantum dots. The description of the quantum dot 220q described above with reference to FIG. 3 may be similarly applied to the first quantum dots, the second quantum dots, and the third quantum dots.

The first openings OPr' may respectively define the first emission areas EAr' of the first display elements DEr', the second openings OPg' may respectively define the second emission area EAg' of the second display elements DEg', and the third openings OPb' may respectively define the third emission areas EAb' of the third display elements DEb'. The first openings OPr', the second openings OPg', and the third openings OPb' may be formed in the pixel definition layer PDL as described above with reference to FIG. 3 and may expose at least a portion of the first pixel electrode 210r', the second pixel electrodes 210g', and the third pixel electrodes 210b', respectively.

FIG. 24 illustrates that the first openings OPr', the second openings OPg', and the third openings OPb' have a diamond shape; however, in other embodiments, the first openings OPr', the second openings OPg', and the third openings OPb' may have a polygonal shape such as a triangular, pentagonal, or hexagonal shape, a circular shape, an elliptical shape, an atypical shape, and/or the like.

Also, FIG. 24 illustrates that the first pixel electrodes 210r', the second pixel electrodes 210g', and the third pixel electrodes 210b' have a diamond shape; however, in other embodiments, the first pixel electrodes 210r', the second pixel electrodes 210g', and the third pixel electrodes 210b' may have a polygonal shape such as a triangular, pentagonal, or hexagonal shape, a circular shape, an elliptical shape, an atypical shape, and/or the like.

The second trenches TRb' may be spaced from the first openings OPr', the second openings OPg', and the third openings OPb' in the first direction (e.g., ±y direction) and may extend substantially in the second direction (e.g., ±x direction).

In one or more embodiments, the second direction in which the trenches TRa' extend may not be linear and may be a direction intersecting with the first direction locally. For example, as illustrated in FIG. 24, each of the trenches TRa' may have a zigzag shape.

The trench TRa' may be formed in the pixel definition layer PDL as described above with reference to FIG. 3. The trenches TRa' may be located between rows of the first display elements DEr'. Although the description has been based on the first display element DEr', the description may be similarly applied to the second display element DEg' and the third display element DEb'. For example, the trenches TRa' may be located between rows of the second display elements DEg'. The trenches TRa' may be located between rows of the third display elements DEb'.

The first grooves GVr1' may connect the first openings OPr' to the trenches TRa', the second grooves GVg1' may connect the second openings OPg' to the trenches TRa', and the third grooves GVb1' may connect the third openings OPb' to the trenches TRa'. In other words, the trenches TRa' may be connected to the first openings OPr' through the first grooves GVr1', may be connected to the second openings OPg' through the second grooves GVg1', and may be connected to the third openings OPb' through the third grooves GVb1'. The first grooves GVr1', the second grooves GVg1', and the third grooves GVb1' may be formed in the pixel definition layer PDL as described above with reference to FIG. 3.

Moreover, the trenches TRa', the first grooves GVr1', the second grooves GVg1', and the third grooves GVb1' may function as a path for uniformly diffusing (or transmitting) the aging element AE (e.g., a gas) from the resin layer 240 (see FIG. 9) to the first openings OPr', the second openings OPg', and the third openings OPb' as illustrated in FIG. 23 described above.

Figure 25:
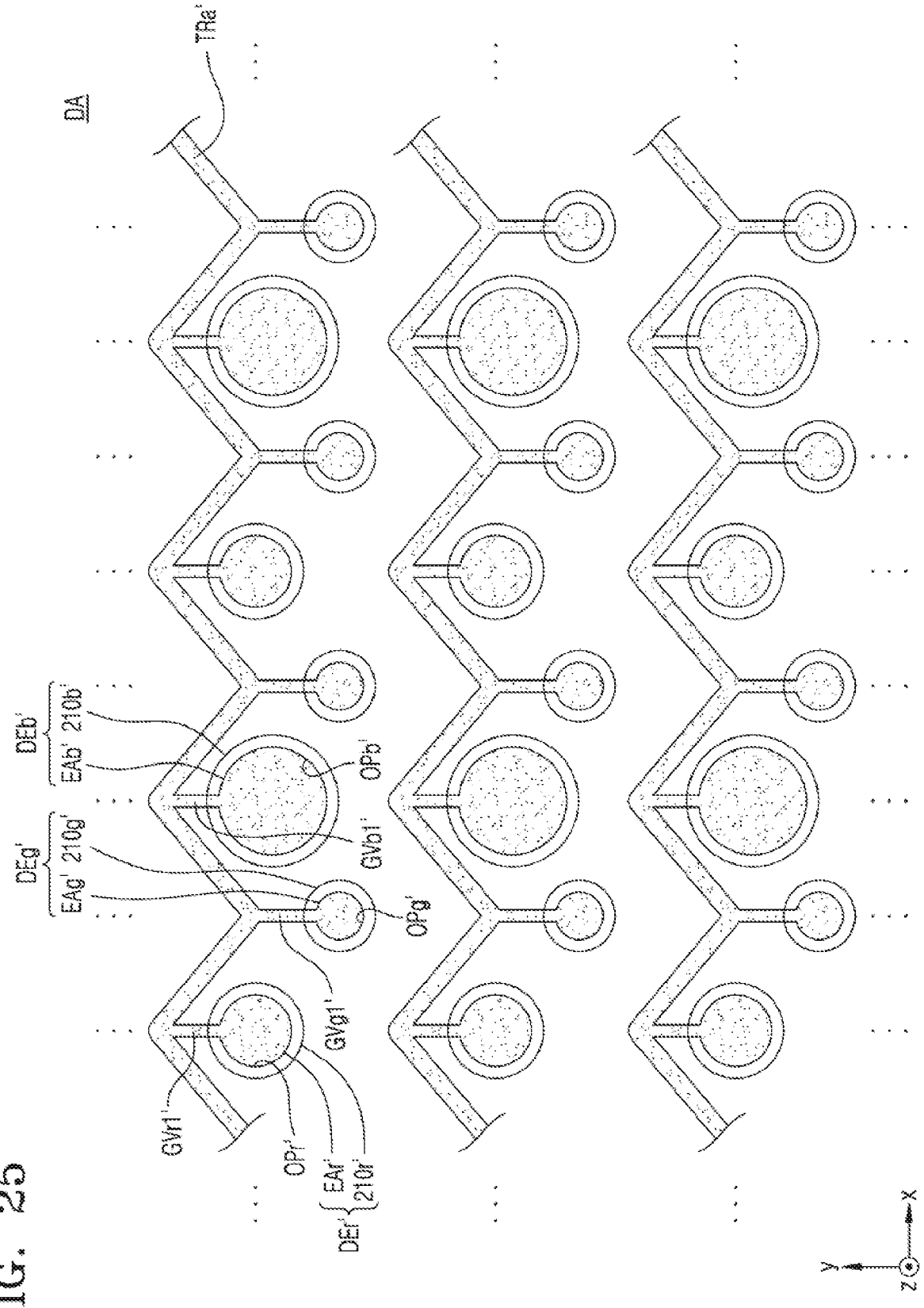
FIG. 25 is an enlarged plan view schematically illustrating a portion of a display apparatus according to one or more embodiments.

FIG. 25 is an enlarged plan view schematically illustrating a portion of a display apparatus according to one or more embodiments. FIG. 25 is a modification of FIG. 24 and may be different from FIG. 24 in terms of the structure of a display element. Hereinafter, redundant descriptions thereof will not be repeated in view of the description of FIG. 25 and differences therebetween will be primarily described.

Referring to FIG. 25, unlike the illustration in FIG. 24, the first openings OPr', the second openings OPg', and the third openings OPb' may have a circular shape.

Also, the first pixel electrodes 210r', the second pixel electrodes 210g', and the third pixel electrodes 210b' may have a circular shape.

Figure 26:
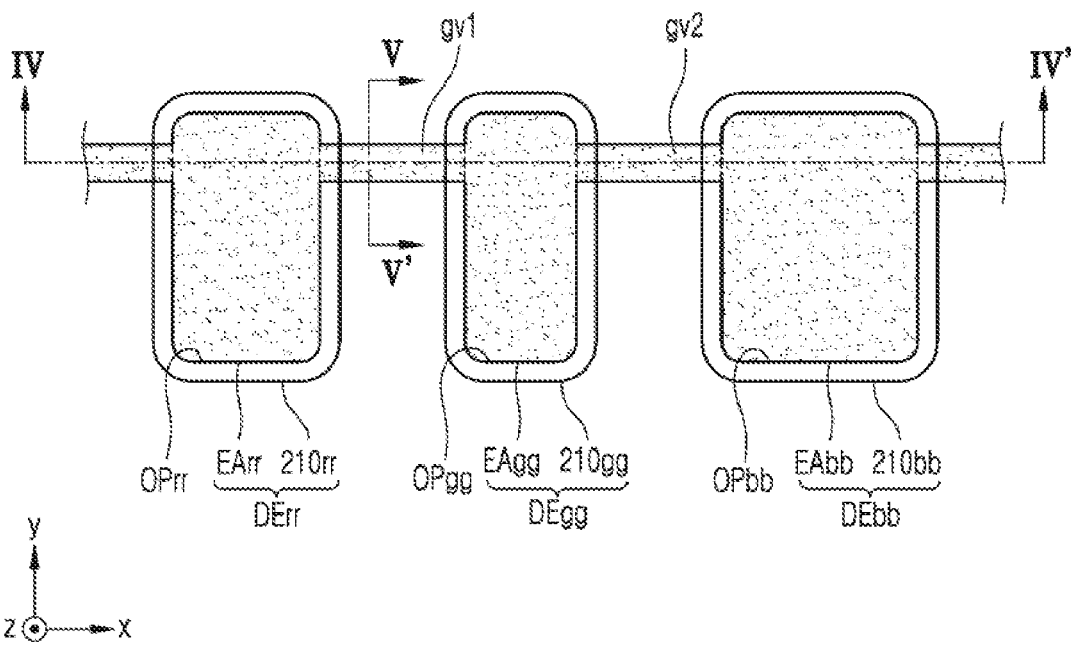
FIG. 26 is an enlarged plan view schematically illustrating a portion of a display apparatus according to one or more embodiments.

FIG. 26 is an enlarged plan view schematically illustrating a portion of a display apparatus according to one or more embodiments.

Referring to FIG. 26, the display apparatus 1 (see FIG. 1) may include a first display element DErr, a second display element DEgg, a third display element DEbb, a first opening OPrr, a second opening OPgg, a third opening OPbb, a first groove gv1, and a second groove gv2 arranged in the display area DA (see FIG. 1).

The first display element DErr may include a first pixel electrode 210rr and a first emission area EArr from which light is emitted, the second display element DEgg may include a second pixel electrode 210gg and a second emission area EAgg from which light is emitted, and the third display element DEbb may include a third pixel electrode 210bb and a third emission area EAbb from which light is emitted. Each of the first display element DErr, the second display element DEgg, and the third display element DEbb may be a quantum-dot light emitting diode including a plurality of quantum dots. In one or more embodiments, the first display element DErr may be greater in size than the second display element DEgg in a plan view. Similarly, in one or more embodiments, the first emission area EArr of the first display element DErr may be greater in size than the second emission area EAgg of the second display element DEgg in a plan view.

Figure 27:
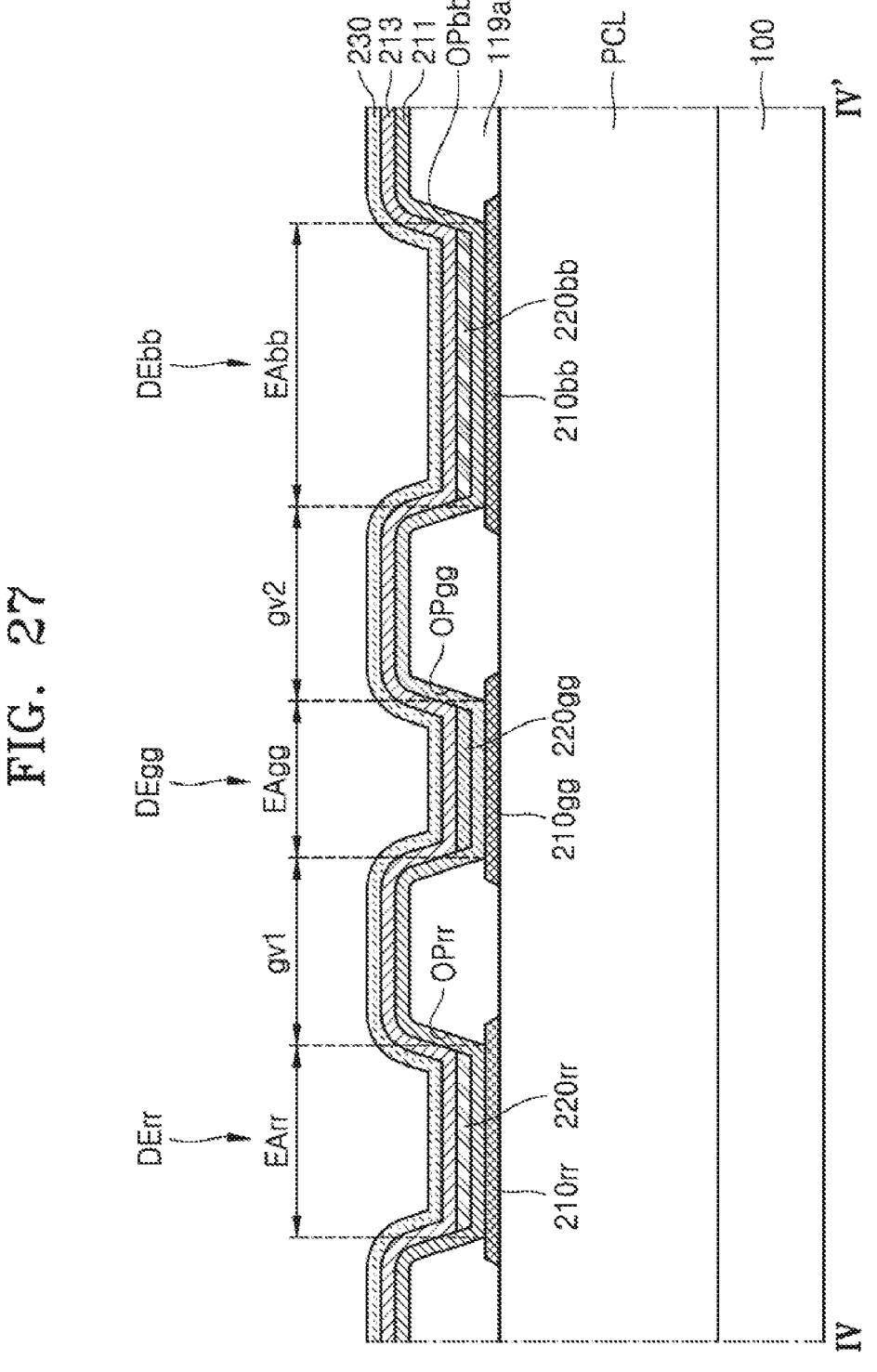
FIG. 27 is a cross-sectional view of a portion of the display apparatus taken along the line IV-IV' of FIG. 26.

In one or more embodiments, the first display element DErr, the second display element DEgg, and the third display element DEbb may emit light of different colors. For example, as illustrated in FIG. 27 described below, the first display element DErr may include a first emission layer 220rr including a plurality of first quantum dots and emitting light of a first color, the second display element DEgg may include a second emission layer 220gg including a plurality of second quantum dots and emitting light of a second color, and the third display element DEbb may include a third emission layer 220bb including a plurality of third quantum dots and emitting light of a third color.

In this case, the size of the first quantum dots, the size of the second quantum dots, and the size of the third quantum dots may be different from each other. For example, when the first color is red, the second color is green, and the third color is blue, the first quantum dots may be largest and the third quantum dots may be smallest. For example, the size of the first quantum dots may be larger than the size of the second quantum dots, and the size of the second quantum dots may be larger than the size of the third quantum dots. The description of the quantum dot 220q described above with reference to FIG. 3 may be similarly applied to the first quantum dots, the second quantum dots, and the third quantum dots.

The first opening OPrr may define the first emission area EArr of the first display element DErr, the second opening OPgg may define the second emission area EAgg of the second display element DEgg, and the third opening OPbb may define the third emission area EAbb of the third display element DEbb. The first opening OPrr, the second opening OPgg, and the third opening OPbb may be formed in the pixel definition layer 119 as described below with reference to FIG. 27 and may expose at least a portion of the first pixel electrode 210rr, the second pixel electrode 210gg, and the third pixel electrode 210bb, respectively.

FIG. 26 illustrates that the first openings OPrr, the second openings OPgg, and the third openings OPbb have a diamond shape; however, in other embodiments, the first openings OPrr, the second openings OPgg, and the third openings OPbb may have a polygonal shape such as a triangular, pentagonal, or hexagonal shape, a circular shape, an elliptical shape, an atypical shape, and/or the like.

Also, FIG. 26 illustrates that the first pixel electrodes 210rr, the second pixel electrodes 210gg, and the third pixel electrodes 210bb have a diamond shape; however, in other embodiments, the first pixel electrodes 210rr, the second pixel electrodes 210gg, and the third pixel electrodes 210bb may have a polygonal shape such as a triangular, pentagonal, or hexagonal shape, a circular shape, an elliptical shape, an atypical shape, and/or the like.

The first groove gv1 may connect the first opening OPrr to the second opening OPgg, and the second groove gv2 may connect the second opening OPgg to the third opening OPbb. In other words, the first opening OPrr and the second opening OPgg may be connected to each other through the first groove gv1, and the second opening OPgg and the third opening OPbb may be connected to each other through the second groove gv2. The first groove gv1 and the second groove gv2 may be formed in the pixel definition layer 119 as illustrated in FIGS. 27 and 28 described below.

Moreover, the first groove gv1 and the second groove gv2 may function as a path for uniformly diffusing (or transmitting) the aging element AE (e.g., a gas) from the resin layer 240 (see FIG. 9) to the first openings OPrr, the second openings OPgg, and the third openings OPbb as illustrated in FIG. 23 described above.

Figure 28:
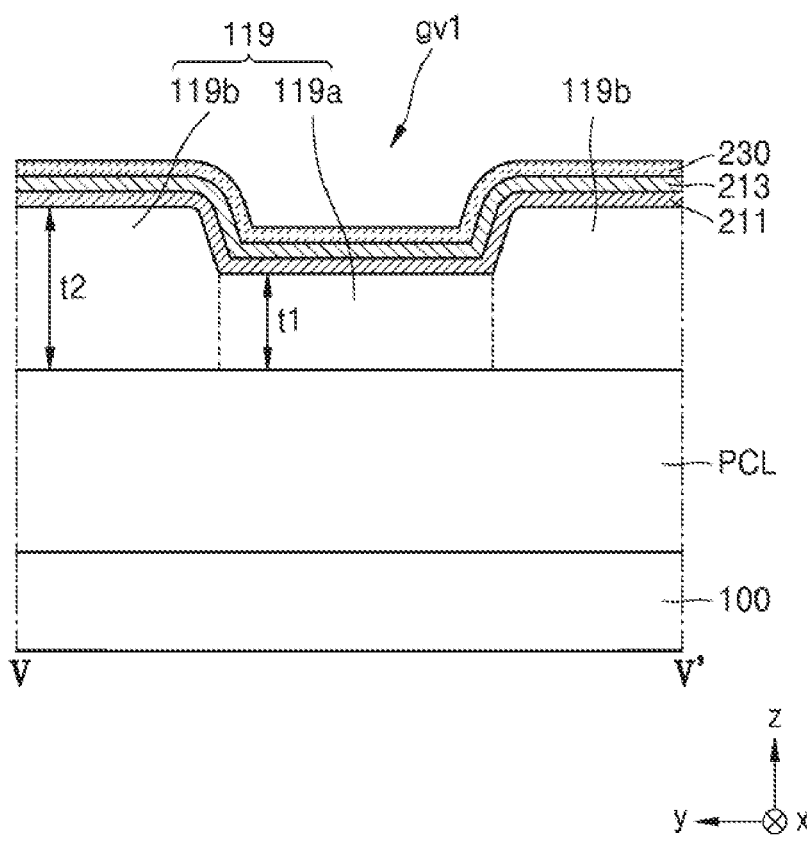
FIG. 28 is a cross-sectional view of a portion of the display apparatus taken along the line V-V' of FIG. 26.

FIG. 27 is a cross-sectional view of a portion of the display apparatus taken along the line IV-IV' of FIG. 26, and FIG. 28 is a cross-sectional view of a portion of the display apparatus taken along the line V-V' of FIG. 26.

Referring to FIGS. 27 and 28, the display apparatus 1 (see FIG. 1) may include a substrate 100, a circuit layer PCL on the substrate 100, a pixel definition layer 119 on the circuit layer PCL, and a first display element DErr, a second display element DEgg, and a third display element DEbb on the circuit layer PCL.

The pixel definition layer 119 may include a first opening OPrr exposing at least a portion of the first pixel electrode 210rr, a second opening OPgg exposing at least a portion of the second pixel electrode 210gg, and a third opening OPbb exposing at least a portion of the third pixel electrode 210bb. The first opening OPrr may define the first emission area EArr, the second opening OPgg may define the second emission area EAgg, and the third opening OPbb may define the third emission area EAbb.

The pixel definition layer 119 may include a first groove gv1 connecting the first opening OP1 to the second opening OP2 and a second groove gv2 connecting the second opening OP2 to a third opening OP3. For example, as illustrated in FIG. 28, the pixel definition layer 119 may include a first portion 119a corresponding to the first groove gv1 and a second portion 119b around (e.g., surrounding) at least a portion of the first portion 119a. In this case, a first thickness t1 of the first portion 119a may be less than a second thickness t2 of the second portion 119b. Although the first groove gv1 has been described as a reference, the description of the first groove gv1 may be similarly applied to the second groove gv2.

The first emission layer 220rr may be arranged in the first opening OPrr, the second emission layer 220gg may be arranged in the second opening OPgg, and the third emission layer 220bb may be arranged in the third opening OPbb. The first emission layer 220rr, the second emission layer 220gg, and the third emission layer 220bb may include a plurality of quantum dots 220q (see FIG. 3). The first emission layer 220rr, the second emission layer 220gg, and the third emission layer 220bb may include a quantum-dot material. The core of the quantum dot 220q may be selected from a Group II-VI compound, a Group III-V compound, a Group IV-VI compound, a group IV element, a Group IV compound, and any combination thereof.

Moreover, although not illustrated in FIGS. 27 and 28, an encapsulation substrate may be arranged to face the substrate 100. In the peripheral area PA (see FIG. 1), the substrate 100 and the encapsulation substrate may be sealed by being attached with a sealing material such as frit.

Figure 29:
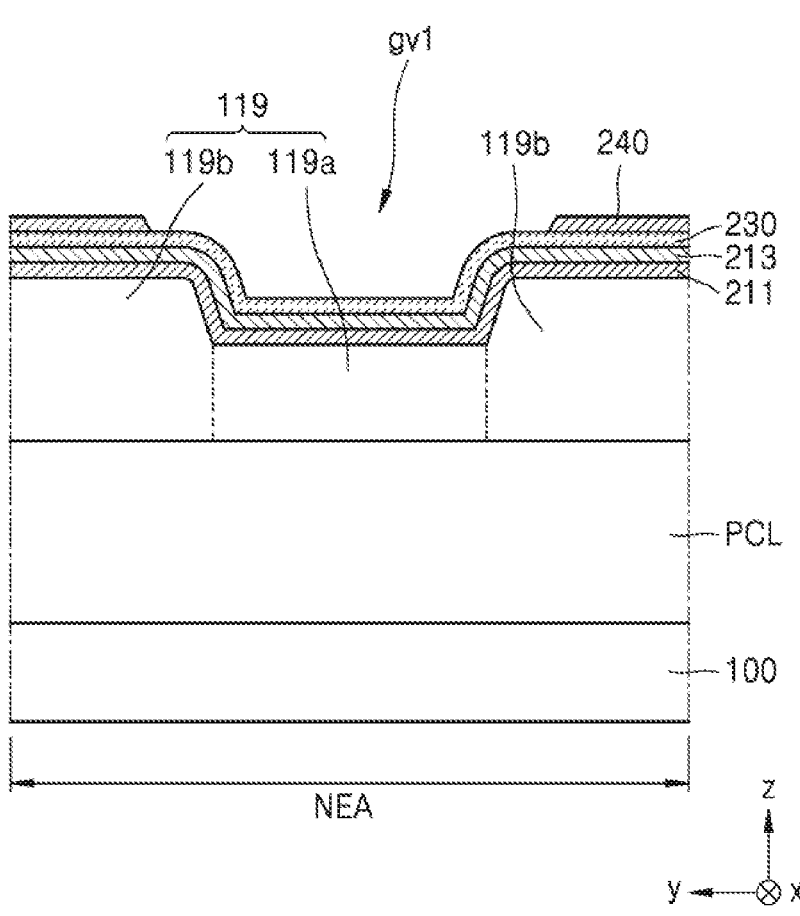
FIG. 29 is a cross-sectional view of a portion of the display apparatus taken along the line V-V' of FIG. 26.

FIG. 29 is a cross-sectional view of a portion of the display apparatus taken along the line V-V' of FIG. 26. FIG. 29 is a modification of FIG. 28 and may be different from FIG. 28 in terms of the structure of a resin layer. Hereinafter, redundant descriptions thereof will not be repeated in view of the description of FIG. 28 and differences therebetween will be primarily described.

Referring to FIG. 29, the display apparatus 1 (see FIG. 1) may further include a resin layer 240 arranged in a non-emission area NEA. In the display area DA (see FIG. 1), the non-emission area NEA may be defined as an area other than the first emission area EArr, the second emission area EAgg, and the third emission area EAbb illustrated in FIG. 27 described above.

The resin layer 240 may be arranged on the opposite electrode 230. The resin layer 240 may surround at least a portion of the first groove gv1 as illustrated in FIG. 29. Although the first groove gv1 has been described as a reference, the description of the first groove gv1 may be similarly applied to the second groove gv2.

As a comparative example, a resin layer may be arranged in an emission area. In this case, as described below, the resin layer may include an acid, and when the resin layer including the acid is arranged on an opposite electrode on the emission area, the acid of the resin layer may permeate through the surface of the opposite electrode, and as a result, the emission efficiency of the display element may be degraded or a lighting failure of the display element may occur.

However, when the resin layer 240 is arranged in the non-emission area NEA as in one or more embodiments, the emission efficiency degradation, the lighting failure, and/or the like of the display element due to the oxidation of the opposite electrode 230 on the emission area may be prevented or reduced.

The resin layer 240 may include a (thermo)setting resin, an acrylic resin, and/or the like. The resin layer 240 may include (or contain) an aging element. For example, the aging element may be an acrylic acid, a gas, and/or the like. The gas may be acid gas. The gas may be hydrogen gas (e.g., H+ gas).

Moreover, although not illustrated in FIG. 29, a capping layer may be arranged between the opposite electrode 230 and the resin layer 240. The capping layer may be configured to protect the opposite electrode 230 and may be configured to increase the light extraction efficiency. For example, the capping layer may include a material having a refractive index of about 1.2 to about 3.1. Also, the capping layer may include an organic material.

Moreover, FIG. 29 illustrates that the resin layer 240 is arranged in the non-emission area NEA of the display area DA; however, the resin layer 240 may be arranged in the non-emission area NEA of the display area DA and/or the peripheral area PA (see FIG. 10). For example, the resin layer 240 may be arranged in both the non-emission area NEA of the display area DA and the peripheral area PA.

According to one or more embodiments described above, a display apparatus capable of promoting a positive aging effect of a quantum-dot light emitting diode and a method of manufacturing the display apparatus may be implemented. However, the scope of the present disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A display apparatus comprising:
   a substrate having a display area and a peripheral area surrounding at least a portion of the display area;
   a first display element in the display area and comprising a first emission layer comprising a plurality of first quantum dots, the first emission layer to emit light of a first color; and
   a pixel definition layer on the substrate and including a first opening defining a first emission area of the first display element, a first trench spaced from the first opening in a first direction and extending in a second direction intersecting the first direction, and a first groove connecting the first opening to the first trench.

2. The display apparatus of claim 1, further comprising a second display element in the display area and comprising a second emission layer comprising a plurality of second quantum dots, the second emission layer to emit light of a second color,
   wherein the pixel definition layer further comprises a second opening defining a second emission area of the second display element, and a second groove connecting the second opening to the first trench.

3. The display apparatus of claim 2, wherein the first groove includes a plurality of first grooves,
   wherein the second groove includes a plurality of second grooves,
   wherein the first opening is larger than the second opening, and
   wherein a number of the plurality of first grooves is greater than a number of the plurality of second grooves.

4. The display apparatus of claim 2, wherein the first opening is larger than the second opening, and
   wherein a first width of the first groove in the second direction is greater than a second width of the second groove in the second direction.

5. The display apparatus of claim 1, wherein the first display element comprises:

a pixel electrode at least partially exposed by the first opening;

a first functional layer between the pixel electrode and the first emission layer and at least partially in the first opening, the first groove, and the first trench;

a second functional layer on the first emission layer and at least partially in the first opening, the first groove, and the first trench; and an opposite electrode on the second functional layer and at least partially in the first opening, the first groove, and the first trench.

6. The display apparatus of claim 5, further comprising a resin layer in the peripheral area and on the opposite electrode.

7. The display apparatus of claim 5, further comprising a resin layer in the display area and surrounding at least a portion of the first opening, the first groove, and the first trench on the opposite electrode.

8. The display apparatus of claim 1, wherein the pixel definition layer comprises a first portion corresponding to the first trench and the first groove and having a first thickness, and a second portion surrounding at least a portion of the first portion and having a second thickness greater than the first thickness.

9. The display apparatus of claim 1, further comprising an insulating layer between the substrate and the first display element, wherein the pixel definition layer exposes at least a portion of the insulating layer corresponding to the first trench.

10. The display apparatus of claim 9, wherein the pixel definition layer comprises a first portion corresponding to the first groove and having a first thickness, and a second portion surrounding at least a portion of the first portion and having a second thickness greater than the first thickness.

11. The display apparatus of claim 1, wherein the pixel definition layer comprises a first portion corresponding to the first trench, a second portion corresponding to the first groove, and a third portion surrounding at least a portion of the first portion and the second portion, wherein a first vertical distance from an upper surface of the substrate to an upper surface of the first portion is less than a second vertical distance from the upper surface of the substrate to an upper surface of the second portion, and wherein the second vertical distance is less than a third vertical distance from the upper surface of the substrate to an upper surface of the third portion.

12. The display apparatus of claim 1, wherein the pixel definition layer further comprises a second trench spaced from the first opening in the first direction and extending in the second direction, and a second groove connecting the first opening to the second trench, and wherein the first opening is located between the first trench and the second trench.

13. The display apparatus of claim 1, wherein the first display element comprises a plurality of first display elements, the first opening includes a plurality of first openings, the first trench comprises a plurality of first trenches, and the first groove includes a plurality of first grooves, wherein the plurality of first display elements are arranged in a matrix in the first direction and the second direction, wherein the plurality of first openings respectively define first emission areas of the plurality of first display elements, wherein the plurality of first trenches are located between rows of the plurality of first display elements, and wherein the plurality of first grooves connect the plurality of first openings to the plurality of first trenches.

* * * * *